US008921162B2

(12) United States Patent
Wada

(10) Patent No.: US 8,921,162 B2
(45) Date of Patent: Dec. 30, 2014

(54) METHOD FOR MANUFACTURING ELECTRONIC COMPONENT, AND ELECTRONIC APPARATUS

(71) Applicant: Seiko Epson Corporation, Tokyo (JP)

(72) Inventor: Kenji Wada, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/896,686

(22) Filed: May 17, 2013

(65) Prior Publication Data

US 2013/0307124 A1   Nov. 21, 2013

(30) Foreign Application Priority Data

May 18, 2012  (JP) ................. 2012-114997

(51) Int. Cl.
| H01L 21/44 | (2006.01) |
| H01L 21/48 | (2006.01) |
| H01L 21/50 | (2006.01) |
| H01L 23/544 | (2006.01) |
| H01L 23/00 | (2006.01) |
| H01L 21/78 | (2006.01) |
| H01L 23/055 | (2006.01) |

(52) U.S. Cl.
CPC .............. *H01L 21/78* (2013.01); *H01L 23/544* (2013.01); *H01L 24/81* (2013.01); *H01L 23/055* (2013.01)
USPC ......................................... 438/113

(58) Field of Classification Search
CPC ................. H01L 21/78; H01L 23/44
USPC ......................................... 438/113
See application file for complete search history.

(56) References Cited

U.S. PATENT DOCUMENTS

2009/0267230 A1* 10/2009 Hwan .................... 257/737
2013/0099308 A1*  4/2013 Gruber et al. ............ 257/330

FOREIGN PATENT DOCUMENTS

| JP | 2002-016161 A | 1/2002 |
| JP | 2002-246491 A | 8/2002 |
| JP | 2002-352951 A | 12/2002 |
| JP | 2003-181825 A | 7/2003 |
| JP | 2006-066629 A | 3/2006 |
| JP | 2008-135727 A | 6/2008 |

* cited by examiner

*Primary Examiner* — David S Blum
(74) *Attorney, Agent, or Firm* — Harness, Dickey & Pierce, P.L.C.

(57) ABSTRACT

A method for manufacturing an electronic component includes mounting a vibrating element on each singulation region of a base substrate, joining the surface of a lid substrate where grooves are arranged to the base substrate via low-melting glass so as to cover a functional element in each singulation region, thereby obtaining a laminate, and performing singulation in each singulation region by breaking the laminate along grooves.

8 Claims, 22 Drawing Sheets

METHOD FOR MANUFACTURING ELECTRONIC COMPONENT, AND ELECTRONIC APPARATUS

BACKGROUND

1. Technical Field

The present invention relates to a method for manufacturing an electronic component, and an electronic apparatus.

2. Related Art

For example, electronic components in which a functional element, such as a vibrating element, is stored in a storage space formed in a package have been known in the related art. Additionally, a method described in JP-A-2008-135727 is known as a method for manufacturing the package. The manufacturing method described in JP-A-2008-135727 has preparing a ceramic substrate having a plurality of recesses, joining a lid to the ceramic substrate via a joining material to obtain a laminate, and singulating the laminate by cutting. However, JP-A-2008-135727 has problems in that the laminate should be cut and singulated by sandblasting or a singulating saw, and a singulating step is complicated.

SUMMARY

An advantage of some aspects of the invention is to provide a method for manufacturing an electronic component that can simply and reliably perform singulation and an electronic apparatus with high reliability including an electronic component manufactured by the manufacturing method.

The invention can be implemented as the following forms or application examples.

APPLICATION EXAMPLE 1

This application example is directed to a method for manufacturing an electronic component including preparing a base substrate that has front and rear surfaces, has a plurality of singulation regions arranged on the front surface thereof, and has grooves for singulating the singulation regions arranged on the rear surface thereof, and a lid substrate that has grooves for singulation together with the base substrate arranged therein; mounting a functional element on each of the singulation regions of the base substrate; joining the surface of the lid substrate, where the grooves are arranged, to the base substrate via a glass material so as to cover the functional element in each of the singulation regions, thereby obtaining a laminate; and singulating each of the singulation regions by breaking the laminate along a groove arranged in the base substrate and a groove arranged in the lid substrate.

By forming the grooves for singulation in the same direction in the base substrate and the lid substrate in this way, the laminate can be simply and reliably singulated.

APPLICATION EXAMPLE 2

In the method for manufacturing an electronic component according to the application example, it is preferable that the base substrate has a frame-shaped protrusion that protrudes from the front surface of the base substrate and has the functional element to be arranged therein, and a bottomed recess between a pair of the adjacent protrusions, and the laminate is configured such that a bottom portion of a groove arranged in the base substrate and a groove arranged in the lid substrate at least partially overlap a bottom surface of the recess in a plan view in the thickness direction of the laminate, respectively.

Thereby, a crack that is made in the base substrate from a groove formed in the base substrate can be guided to the lower surface of the recess, and a crack is made in the lid substrate from a groove formed in the lid substrate so as to overlap the recess. Since a region that overlaps the recess is located outside an accommodation space that accommodates the functional element, damage to an internal space can be effectively prevented by performing singulation using such a region.

APPLICATION EXAMPLE 3

In the method for manufacturing an electronic component according to the application example, it is preferable that the lid substrate has a plurality of recesses for accommodating the functional element in each of the singulation regions in the surface of the lid substrate where the grooves are arranged, a groove arranged in the lid substrate is located between a pair of the adjacent recesses in a plan view in the thickness direction of the lid substrate, and is provided so as to split the recesses, and the laminate is configured such that a bottom portion of a groove arranged in the base substrate and a bottom surface of a recess arranged in the lid substrate at least partially overlap each other in a plan view in the thickness direction of the laminate, respectively.

Thereby, a crack can be effectively prevented from being made in an accommodation space that accommodates the functional element, and damage to an internal space can be effectively prevented.

APPLICATION EXAMPLE 4

This application example is directed to a method for manufacturing an electronic component including preparing a base substrate that has a plurality of singulation regions, and has grooves for singulating the singulation regions, and a lid substrate that has front and rear surfaces and has grooves for singulation together with the base substrate arranged on the front surface thereof; mounting a functional element on each of the singulation regions of the front surface of the base substrate where the grooves are arranged; joining the rear surface side of the lid substrate to the base substrate via a glass material so as to cover the functional element in each of the singulation regions, thereby obtaining a laminate; and singulating the laminate in each of the singulation region along a groove arranged in the base substrate and a groove arranged in the lid substrate.

By forming the grooves for singulation in the same direction in the base substrate and the lid substrate in this way, the laminate can be simply and reliably singulated.

APPLICATION EXAMPLE 5

In the method for manufacturing an electronic component according to the application example, it is preferable that the lid substrate has a frame-shaped protrusion that protrudes from the rear surface of the lid substrate and has a functional element accommodated therein, and a bottomed recess between a pair of the adjacent protrusions, and the laminate is configured such that a bottom portion of a groove arranged in the base substrate and a groove arranged in the lid substrate at least partially overlap a bottom surface of the recess in a plan view in the thickness direction of the laminate, respectively.

Thereby, a crack that is made in the base substrate from a groove formed in the base substrate can be guided to the lower surface of the recess, and a crack is made in the lid substrate from a groove formed in the lid substrate so as to overlap the recess. Since a region that overlaps the recess is located outside an accommodation space that accommodates the functional element, damage to an internal space can be effectively prevented by performing singulation using such a region.

APPLICATION EXAMPLE 6

In the method for manufacturing an electronic component according to the application example, it is preferable that the base substrate has a plurality of recesses for accommodating the functional element in each of the singulation regions in the surface of the base substrate where the grooves are arranged, a groove arranged in the base substrate is located between a pair of the adjacent recesses in a plan view in the thickness direction of the base substrate, and is provided so as to split the recesses, the laminate is configured such that a bottom portion of a groove arranged in the lid substrate and a bottom surface of a recess arranged in the base substrate at least partially overlap each other in a plan view in the thickness direction of the laminate.

Thereby, a crack can be effectively prevented from being made in an accommodation space that accommodates the functional element, and damage to an internal space can be effectively prevented.

APPLICATION EXAMPLE 7

In the method for manufacturing an electronic component according to the application example, it is preferable that the glass material is arranged in the laminate so as to avoid a groove arranged in the base substrate and a groove arranged in the lid substrate.

This prevents damage to the glass material during the singulation.

APPLICATION EXAMPLE 8

In the method for manufacturing an electronic component according to the application example, it is preferable that the glass material is arranged in the laminate so as to avoid a groove arranged in the base substrate and a groove arranged in the lid substrate.

This prevents damage to the glass material during the singulation.

APPLICATION EXAMPLE 9

This application example is directed to an electronic component including a base substrate having a fracture surface on a side surface, a lid substrate having a fracture surface on a side surface, and a functional element covered with the base substrate and the lid substrate.

Thereby, an electronic component in which the configuration of a package is simple is obtained.

APPLICATION EXAMPLE 10

This application example is directed to an electronic apparatus including an electronic component including a base substrate having a fracture surface on a side surface, a lid substrate having a fracture surface on a side surface, and a functional element covered with the base substrate and the lid substrate.

Thereby, a reliable electronic apparatus is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

A method for manufacturing an electronic component and an electronic apparatus according to the invention will be described below in detail with reference to preferred embodiments illustrated in the accompanying drawings.

First Embodiment

First, a first embodiment of the method for manufacturing an electronic component of the invention will be described.

Figure 1:
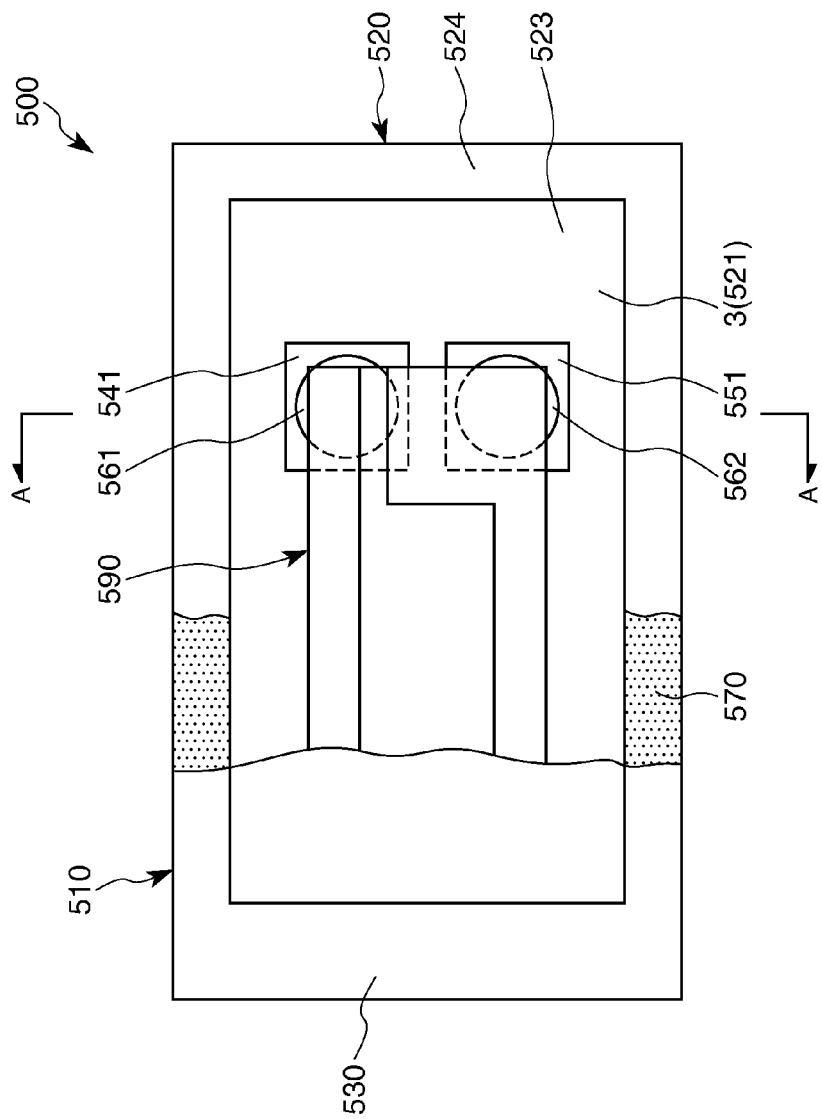
FIG. 1 is a plan view illustrating an electronic component manufactured by a method for manufacturing an electronic component related to a first embodiment of the invention.
Figure 2:
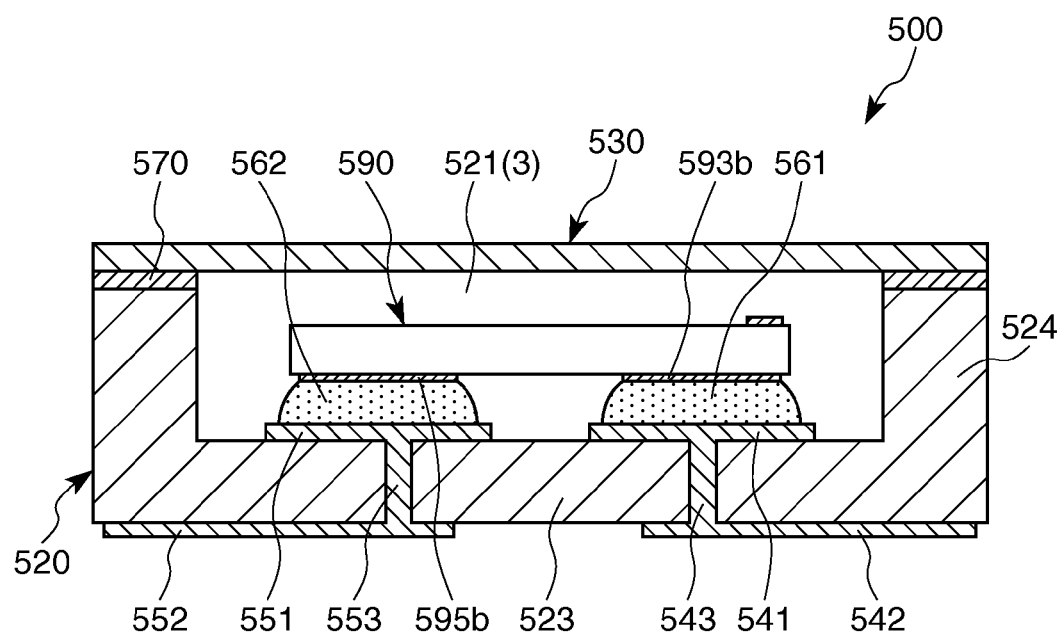
FIG. 2 is a cross-sectional view of the electronic component illustrated in FIG. 1.
Figure 3A:
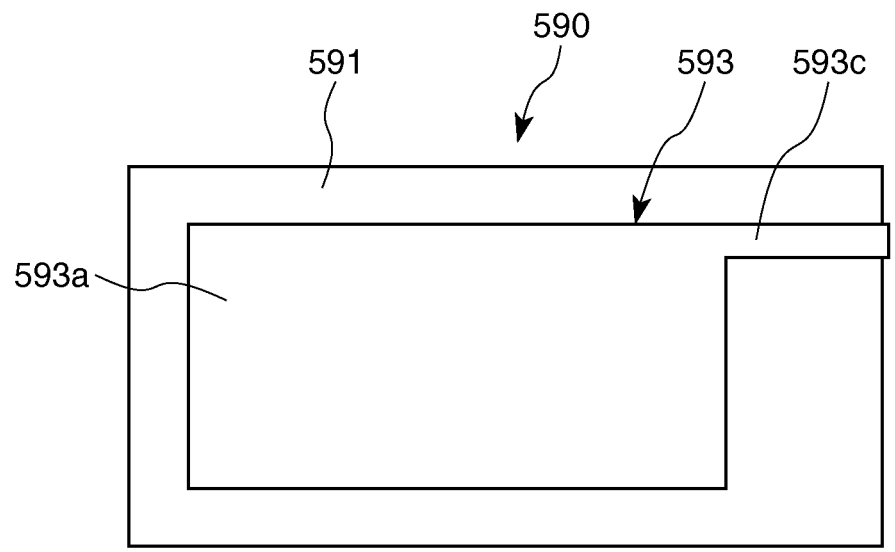
FIGS. 3A and 3B are plan views of a vibrating element that the electronic component illustrated in FIG. 1 has.
Figure 3B:
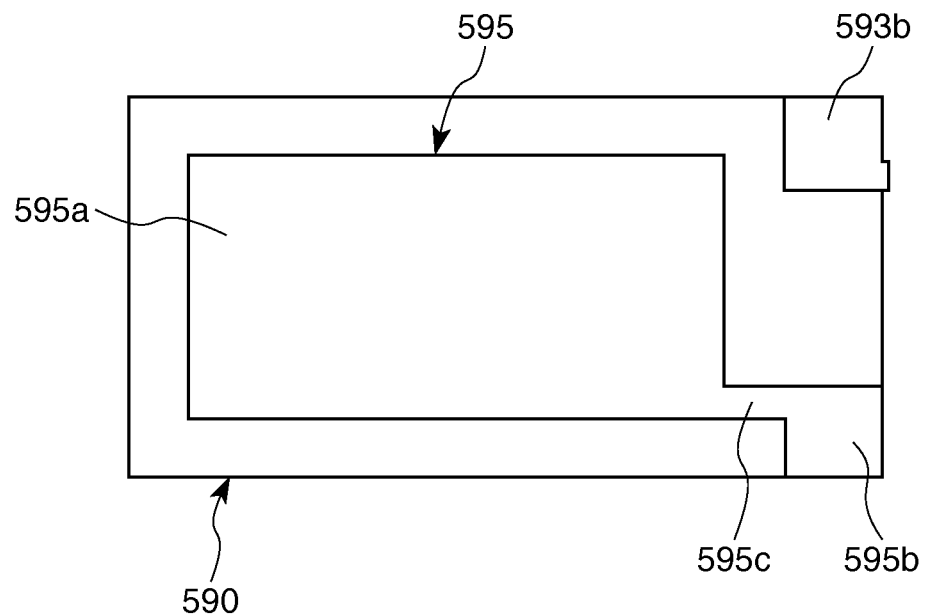

FIG. 1 is a plan view illustrating an electronic component manufactured by the method for manufacturing an electronic component related to the first embodiment of the invention, FIG. 2 is a cross-sectional view of the electronic component illustrated in FIG. 1, FIGS. 3A and 3B are plan views of a vibrating element that the electronic component illustrated in FIG. 1 has, and FIGS. 4 to 7 are cross-sectional views for describing the method for manufacturing an electronic component related to the first embodiment of the invention. In addition, description will be made below with the upper side in FIG. 2 and FIG. 4A to FIG. 7B as "upper" and the lower side as "lower" for convenience of description.

1. Electronic Component

As illustrated in FIGS. 1 and 2, an electronic component 500 has a package 510 and a vibrating element 590 as a functional element that is accommodated within the package 510. In addition, the electronic component 500 is manufactured by a manufacturing method to be described below.

1-1. Vibrating Element

FIG. 3A is a plan view when the vibrating element 590 is viewed from above, and FIG. 3B is a see-through view (plan view) when the vibrating element 590 is viewed from above. As illustrated in FIGS. 3A and 3B, the vibrating element 590 has a piezoelectric substrate 591 of which the shape in a plan view is an oblong (rectangular) plate shape, and a pair of excitation electrodes 593 and 595 that are formed on the front surface of the piezoelectric substrate 591.

The piezoelectric substrate 591 is a crystal blank that mainly performs thickness slip vibration. In the present embodiment, a crystal blank sliced at a cutting angle referred to as AT cut is used as the piezoelectric substrate 591. In addition, the AT cut means performing slicing so as to have a principal plane (principal plane including an X-axis and a Z'-axis) obtained by rotating a plane (Y-plane) including the X-axis and a Z-axis, which are crystal axes of quartz crystal, by about 35°15' counterclockwise from the Z-axis around the X-axis.

The longitudinal direction of the piezoelectric substrate 591 having such a configuration coincides with the X-axis that is the crystal axis of the quartz crystal.

The excitation electrode 593 has an electrode portion 593a that is formed on the upper surface of the piezoelectric substrate 591, a bonding pad 593b that is formed on the lower surface of the piezoelectric substrate 591, and wiring 593c that electrically connects the electrode portion 593a and the bonding pad 593b.

On the other hand, the excitation electrode 595 has an electrode portion 595a that is formed on the lower surface of the piezoelectric substrate 591, a bonding pad 595b that is formed on the lower surface of the piezoelectric substrate 591, and wiring 595c that electrically connects the electrode portion 595a and the bonding pad 595b.

The electrode portions 593a and 595a are provided to face each other via the piezoelectric substrate 591, and have almost the same shape each other. That is, in a plan view of the piezoelectric substrate 591, the electrode portions 593a and 595a are located so as to overlap each other, and are formed so that outlines thereof coincide with each other.

Additionally, the bonding pads 593b and 595b are formed at the right end in FIG. 3B on the lower surface of the piezoelectric substrate 591 so as to be spaced apart from each other.

Such excitation electrodes 593 and 595 can be formed, for example, by forming a film of nickel (Ni) or chromium (Cr) foundation layer on the piezoelectric substrate 591 by vapor deposition or sputtering, then forming a film of golden (Au) electrode layer on the foundation layer by vapor deposition or sputtering, and then performing patterning in a desired shape by a photolithographic technique and an etching technique. By forming the foundation layer, adhesion between the piezoelectric substrate 591 and the electrode layer improves, and a highly-reliable vibrating element 590 is obtained.

In addition, the configurations of the excitation electrodes 593 and 595 are not limited to the above configurations, and for example, the foundation layer may be omitted. The constituent materials of the excitation electrodes may be other materials (for example, various metallic materials such as silver (Ag), copper (Cu), tungsten (W), and molybdenum (Mo)), having conductivity.

1-2. Package

As illustrated in FIGS. 1 and 2, the package 510 has a base substrate 520 that has a recess 521 opening to the upper surface, and a lid 530 that closes an opening of the recess 521. In such a package 510, the inside of the recess 521 closed by the lid 530 functions as a storage space 3 that stores the aforementioned vibrating element 590.

The base substrate 520 has a plate-shaped base 523 and a frame-shaped side wall 524 that is provided on the upper surface of the base 523, and thereby, the recess 521 that opens at a central portion of the upper surface of the base substrate 520 is formed.

The constituent material of the base substrate 520 is not particularly limited if the constituent material has insulation. For example, various ceramics like oxide-based ceramics such as alumina, silica, titania, and zirconia; nitride-based ceramics such as silicon nitride, aluminum nitride, and titanium nitride; and carbide-based ceramics such as silicon carbide, can be used as the constituent material of the base substrate.

A pair of connection electrodes 541 and 551 that face the storage space 3 are formed on the upper surface of the base 523. Additionally, a pair of external mounting electrodes 542 and 552 are formed on the lower surface of the base 523. Additionally, the base 523 is formed with through electrodes 543 and 553 that pass through the base in the thickness direction, the connection electrode 541 and the external mounting electrode 542 are electrically connected together via the through electrode 543, and the connection electrode 551 and the external mounting electrode 552 are electrically connected together via the through electrode 553.

The constituent materials of the connection electrodes 541 and 551, the external mounting electrodes 542 and 552, and the through electrodes 543 and 553 are not particularly limited. For example, metallic materials such as gold (Au), a gold alloy, platinum (Pt), aluminum (Al), an aluminum alloy, silver (Ag), a silver alloy, chromium (Cr), a chromium alloy, nickel (Ni), copper (Cu), molybdenum (Mo), niobium (Nb), tungsten (W), iron (Fe), titanium (Ti), cobalt (Co), zinc (Zn), and zirconium (Zr), can be used as the constituent material of these electrodes.

The lid 530 is airtightly joined to the base substrate 520 via low-melting glass (glass material) 570 so as to close an opening of the recess 521 of the base substrate 520. Thereby, the opening of the recess 521 is closed by the lid 530, and the airtight storage space 3 is formed.

The constituent material of the lid 530 is not particularly limited. For example, various ceramics such as oxide ceramics, nitride ceramics, and carbide-based ceramics, can be used as the constituent material of the lid. Among these, it is preferable that the constituent material of the lid 530 be constituted of the same material as the base substrate 520. Thereby, since the coefficients of linear expansion of the lid 530 and the base substrate 520 can be made equal to each other, deflection or the like caused by a temperature rise in the package 510 can be suppressed. Therefore, an unexpected stress (for example, stress generated by the deflection of the package 510) is not easily applied to the vibrating element 590, and degradation of vibration characteristics of the vibrating element 590 can be suppressed. As a result, the high-precision electronic component 500 is obtained. Additionally, the electronic component can be comparatively inexpensively manufactured.

The vibrating element 590 is stored in the storage space 3 of the package 510. The vibrating element 590 stored in the storage space 3 is cantilevered by the base substrate 520 via a pair of conductive adhesives 561 and 562.

The conductive adhesive 561 is provided in contact with the connection electrode 541 and the bonding pad 593b, and the connection electrode 541 and the bonding pad 593b are electrically connected together via the conductive adhesive 561. Another conductive adhesive 562 is provided in contact with the connection electrode 551 and the bonding pad 595b, and the connection electrode 551 and the bonding pad 595b are electrically connected together via the conductive adhesive 562.

Although the electronic component 500 has been described above, a functional element that the electronic component 500 has is not limited to the aforementioned vibrating element 590. The functional element may be, for example, a tuning fork type crystal oscillator, a SAW resonator, an angular-velocity detecting element, an acceleration detecting element, or the like. Additionally, a plurality of functional elements may be stored in the storage space 3. In this case, different functional elements may be stored, or the same functional elements may be stored. Additionally, an IC chip or the like that controls the driving of the functional element or receives a signal from the functional element may be stored. In a case where the IC chip is stored, the IC chip may be provided side by side adjacent to the functional element, or the IC chip may be arranged so as to overlap the functional element in the thickness direction of a casing.

2. Method for Manufacturing Electronic Component

A method for manufacturing the electronic component 500 has a substrate preparing step, a mounting step, a lid substrate placing step, a pressure-reducing step, a melting step, and a singulating step. These respective steps will be described below in detail.

Substrate Preparing Step

This step is preparing a base substrate 100 that has front and rear surfaces, has a plurality of singulation regions arranged on the front surface thereof, and has grooves for singulating the singulation regions arranged on the rear surface thereof, and a lid substrate 200 in which grooves for singulation together with the base substrate 100 are arranged.

The base substrate 100 out of the two substrates can be manufactured as follows, for example.

Figure 4A:
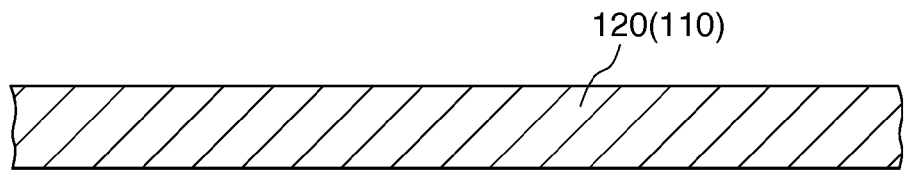
FIGS. 4A to 4D are cross-sectional views for describing the method for manufacturing an electronic component related to the first embodiment of the invention.

First, as illustrated in FIG. 4A, a ceramic green sheet 120 in which a mixture 110 of material powder containing ceramic powder and glass powder and binder is formed in the shape of a sheet by a doctor blade method or the like is prepared. It is preferable that the ceramic green sheet 120 be a single layer. This can reduce the manufacturing costs of the electronic component 500. Additionally, deflection or warpage after sintering can be suppressed.

Next, although not illustrated, the connection electrodes 541 and 551, the external mounting electrodes 542 and 552, and the through electrodes 543 and 553 are formed in each singulation region of the base substrate 100. Although a method for forming these electrodes is not particularly limited, for example, through holes for the through electrodes 543 and 553 are first formed by punch processing or laser processing. Next, conductive portions serving as the through electrodes 543 and 553, the connection electrodes 541 and 551, and the external mounting electrodes 542 and 552 are formed in order by, for example, through screen printing, burying the insides of the through holes with a conductive material and forming films made of a conductive material in predetermined patterns also on the upper surface and lower surface of the base substrate.

Figure 4B:
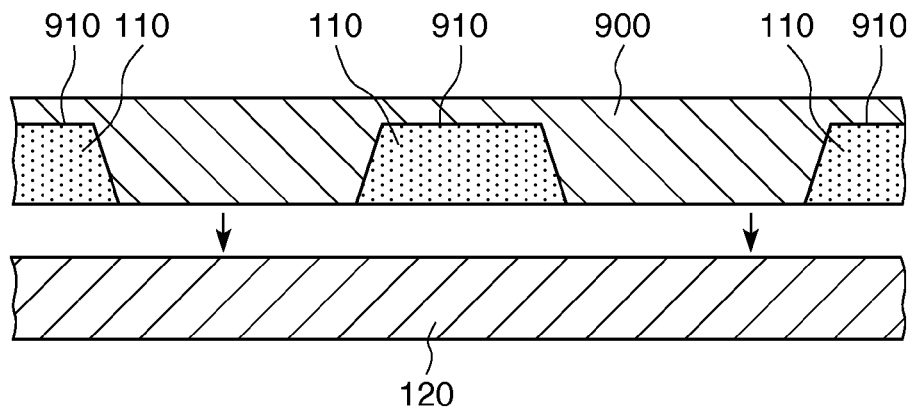
Figure 4C:
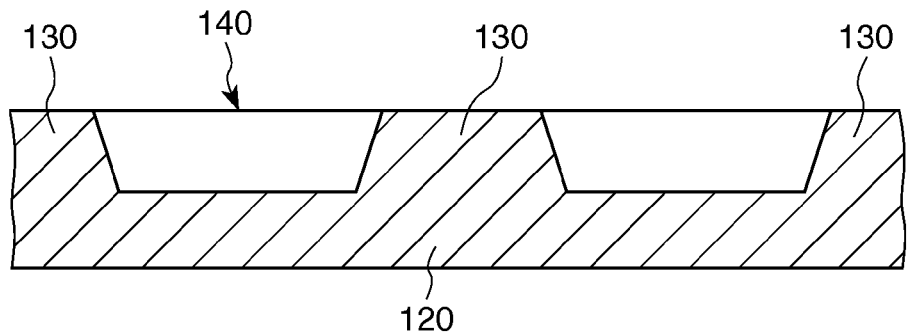

Next, as illustrated in FIG. 4B, a mold 900 that has a plurality of recesses 910 arrayed in a matrix is prepared, and the aforementioned mixture 110 is filled into the recesses 910. Next, the mold 900 is pressed against the upper surface of the ceramic green sheet 120, and grid-like protrusions 130 are formed on the ceramic green sheet 120. Thereby, a ceramic green sheet 140 as illustrated in FIG. 4C is obtained.

Figure 4D:
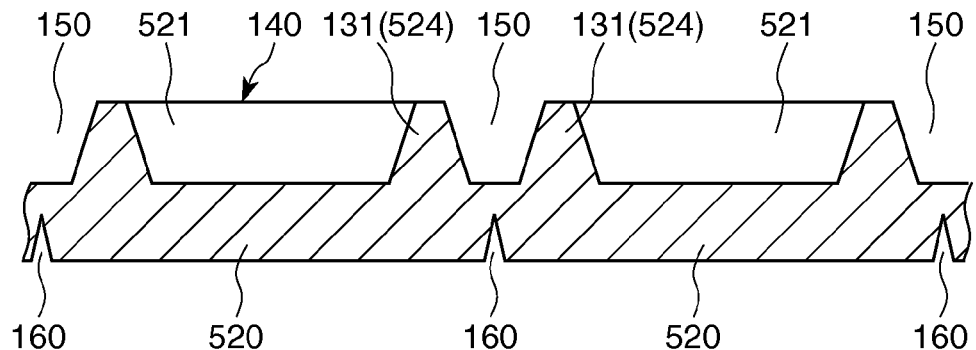

Next, as illustrated in FIG. 4D, grid-like grooves (recesses) 150 that open to the upper surfaces (top surface) of the protrusions 130, and grid-like grooves 160 that open to the lower surface of the ceramic green sheet 140 are formed. Although the grooves 150 and 160 are not particularly limited, for example, these grooves can be formed by knife cutting or by pressing a mold.

Figure 5A:
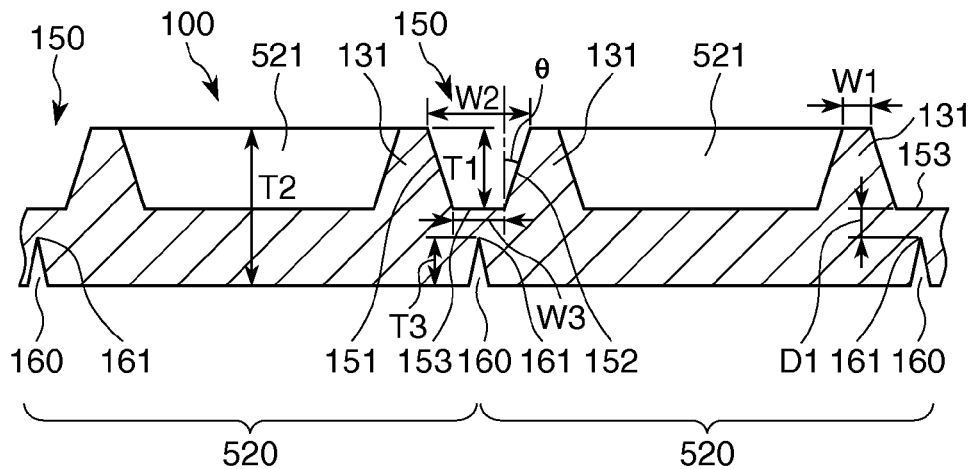
FIGS. 5A to 5C are cross-sectional views for describing the method for manufacturing an electronic component related to the first embodiment of the invention.

Next, the ceramic green sheet 140 is sintered, and as illustrated in FIG. 5A, the base substrate 100 is obtained. In addition, a method for manufacturing the base substrate 100 is not limited to the above method as long as the same configuration is obtained.

In the base substrate 100, the protrusions 130 are split into a plurality of frame-shaped protrusions 131 that are arranged in a matrix by the grooves (recesses) 150. Each of the split protrusions 131 constitutes the side wall 524, and the vibrating element 590 is arranged inside (that is, recess 521) the protrusion in the mounting step to be described below. In other words, the base substrate 100 has the plurality of frame-shaped protrusions 131 that protrude upward and allow the vibrating element 590 to be arranged in each thereof, and the grooves (recesses) 150 each of which is located between a pair of adjacent protrusions 131. Additionally, in the base substrate 100, in a plan view thereof (in a plan view as seen from the thickness direction), each region (singulation region) partitioned by the grooves 150 and 160 is singulated, and serves as one base substrate 520.

Although the width W1 of the upper surface of each protrusion 131 is not particularly limited, it is preferable that the width be within a range from about 50 μm to about 200 μm. As will be described below, low-melting glass 300 is coated on the upper surface of each protrusion 131 (refer to FIG. 5B), and the base substrate 100 and the lid substrate 200 are joined together via the low-melting glass 300. By setting the width W1 to the aforementioned range, a contact surface (coating surface of the low-melting glass) with the low-melting glass 300 can be sufficiently secured while preventing the protrusion 131 from becoming excessively thick, and the base substrate 100 and the lid substrate 200 can be joined together with sufficient strength.

The groove (recess) 150 has a pair of side surfaces 151 and 152, and a bottom surface 153 that couples the side surfaces 151 and 152 together at lower ends thereof. The bottom surface 153 is substantially parallel to the principal plane of the base substrate 100. The side surfaces 151 and 152 form inclined surfaces that incline with respect to the normal line of the base substrate 100, respectively, and the width of the groove 150 decreases gradually from the opening toward the bottom surface 153. That is, the groove 150 has a substantially trapezoidal cross-sectional shape. Although the inclination angle θ of the side surfaces 151 and 152 is not particularly limited, it is preferable that the inclination angle be, for example, from about 10° to about 20°.

Additionally, although the depth T1 of the groove 150 is not particularly limited, it is preferable that the depth be from about 50 µm to about 200 µm. Additionally, it is preferable that the depth T1 be equal to or more than 50% of the thickness T2 of the base substrate 100. That is, it is preferable that T1 and T2 satisfy a relationship that is T1≥T2/2.

Although the width (in other words, the separation distance between the side surfaces 151 and 152 in the opening of the groove 150) W2 of the opening of the groove 150 is not particularly limited, it is preferable that the width be from about 10 µm to about 200 µm. Although the low-melting glass 300 is coated on the upper surface of each protrusion 131 in steps to be described below, the upper surfaces of the adjacent protrusions 131 can be necessarily and sufficiently spaced apart from each other by adopting the aforementioned numerical ranges. Therefore, during a manufacturing step, a non-contact state between the low-melting glass 300 coated on the upper surface of one protrusion 131 and the low-melting glass 300 coated on the upper surface of the other protrusion 131 can be maintained.

Although the width (in other words, the separation distance between the side surfaces 151 and 152 in the bottom surface 153 of the groove 150) W3 of the bottom surface 153 of the groove 150 is not particularly limited, it is preferable that the width be from about 20 µm to about 100 µm. Thereby, the width of the bottom surface 153 is necessarily and sufficiently obtained, and during singulation to be described below, a crack that is made using the groove 160 as a trigger can be more reliably guided to the bottom surface 153.

On the other hand, the groove 160 is formed so that a bottom portion (top portion) 161 thereof overlaps the bottom surface 153 of the groove 150 in a plan view (plan view as seen from the thickness direction) of the base substrate 100. In other words, the groove 160 is formed so that the bottom portion 161 thereof faces the bottom surface 153 of the groove 150 in the thickness direction of the base substrate 100. Thereby, during singulation to be described below, a crack that is made using the groove 160 as a trigger can be more reliably guided to the bottom surface 153.

Additionally, although the cross-sectional shape of the groove 160 is not particularly limited, it is preferable that at least the bottom portion 161 be pointed. In addition, the above "pointed" means that the width of the bottom portion 161 is, for example, equal to or less than 10 µm. The groove 160 of the present embodiment is a substantially V-shaped groove.

Additionally, although the depth T3 of the groove 160 is not particularly limited, it is preferable that the depth be a value such that the separation distance D1 from the bottom surface 153 is equal to or less than 30% of the thickness T2 of the base substrate 100. That is, it is preferable that the depth T3 satisfy a relationship that is (T3+T1)/T2≤0.7. By making the groove 160 have such a depth, during singulation to be described below, a crack that is made using the groove 160 as a trigger can be more reliably guided to the bottom surface 153.

On the other hand, the lid substrate 200 is also made of various ceramics, such as oxide ceramics, nitride ceramics, and carbide-based ceramics. The lid substrate 200 can be manufactured by baking a ceramic green sheet, similar to the aforementioned base substrate 100. That is, the lid substrate is obtained by first preparing a ceramic green sheet obtained by forming the mixture 110 in the shape of a sheet by the doctor blade method or the like, forming grid-like grooves 210 in the lower surface (one surface) of the ceramic green sheet, and then baking the ceramic green sheet. In addition, the grooves 210 will be described below in detail.

Mounting Step

Figure 5B:
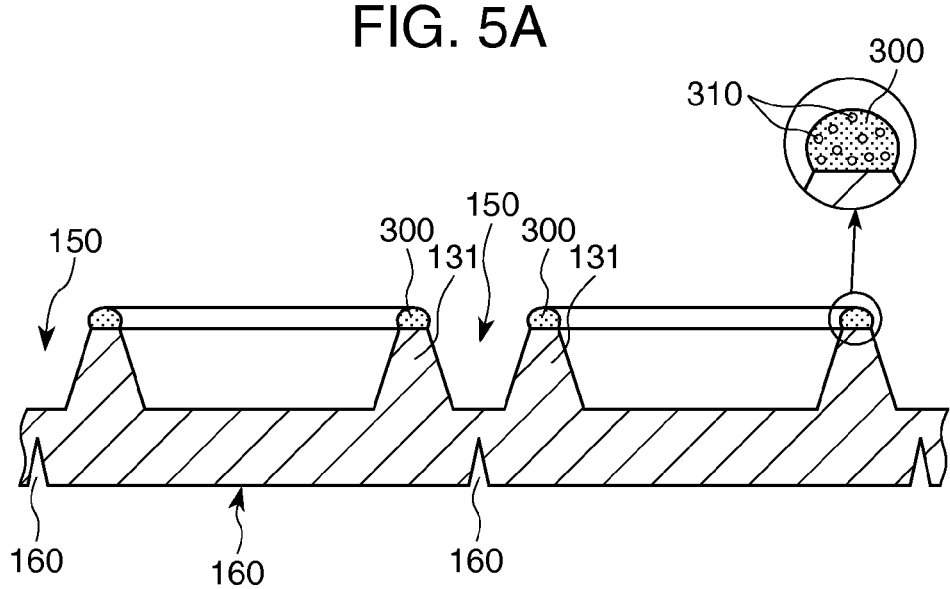

Next, as illustrated in FIG. 5B, the low-melting glass (glass material) 300 in a liquid state is coated over the whole circumference of the upper surface of each protrusion 131. A method for coating the low-melting glass 300 is not particularly limited, and for example, screen printing or the like can be used as the coating method. Additionally, the low-melting glass 300 is not particularly limited. For example, $P_2O_5$—CuO—ZnO-based low-melting glass, $P_2O_5$—SnO-based low-melting glass, $B_2O_3$—ZnO—$Bi_2O_3$—$Al_2O_3$-based low-melting glass, or the like can be used.

Additionally, a plurality of spherical gap materials 310 are contained in the low-melting glass 300. In addition, the shape of the gap materials 310 is not limited to a sphere, and may be, for example, an elliptical spherical shape, a flat shape, a different shape, a block shape, or the like. As such a plurality of gap materials 310, gap materials having a melting point higher than a sealing temperature (a temperature in a second heating state to be described below), that is, gap materials that are not dissolved at the sealing temperature or lower are used.

Although the average particle diameter (average maximum width) of the gap materials 310 are not particularly limited, the average particle diameter is preferably from about 5 µm to about 50 µm, and more preferably from about 10 µm to about 30 µm. Additionally, the standard deviation (the variation of the particle diameters) of the particle diameters of the gap materials 310 is preferably as small as possible. Specifically, the standard deviation is preferably equal to or less than 1.0 µm, and more preferably equal to or less than 0.5 µm.

The constituent materials of such gap materials 310 are not particularly limited, and include, for example, metallic materials, such as Al, Au, Cr, Nb, Ta, and Ti; glass materials, such as quartz glass, silicate glass (quartz glass), alkaline silicate glass, soda-lime glass, potash lime glass, lead (alkali) glass, barium glass, borosilicate glass; ceramic materials, such as alumina, zirconia, ferrite, silicon nitride, aluminum nitride, boron nitride, titanium nitride, silicon carbide, boron carbide, titanium carbide, and tungsten carbide; and carbon materials, such as graphite, and at least one or two kinds of materials among these can be used in combination.

Particularly, it is preferable that the gap materials be high melting-point glass (silica beads) that is not dissolved at a temperature where the low-melting glass 300 melts. According to such materials, since it is glass, there are advantages that familiarity with the low-melting glass 300 is excellent because the gap materials are glass materials, and functions can be exhibited with a small additive amount (about equal to or less than 1 wt %) because higher strength is given.

Next, the low-melting glass 300 is heated to a temperature of about 300° C. to about 400° C. and thereby temporarily baked, and the front surface thereof is made flat and is degassed. By removing gas (oxygen gas or the like) from the low-melting glass 300 to some extent through such temporary baking, the amount of gas that is generated during main baking to be described below can be reduced. Therefore, the amount of gas that is generated in the storage space 3 can be reduced. Therefore, performance degradation of the electronic component 500 can be further suppressed. It is particularly preferable to perform such temporary baking in vacuum (under a reduced-pressure environment). Thereby, the degassing can be more effectively performed. In addition, the temporary baking of the low-melting glass 300 may be performed, for example, after the vibrating element 590 is mounted.

Here, it is preferable that the thickness of the low-melting glass 300 after the temporary baking be larger than the outside dimensions (for example, average particle diameters) of the gap materials 310. Specifically, it is preferable that the thickness be from about 5 μm to about 100 μm, though varying also depending on the outside dimensions of the gap materials 310. Thereby, the base substrate 100 and the lid substrate 200 can be more reliably and airtightly joined together without a gap via the low-melting glass 300.

In addition, if the thickness of the low-melting glass 300 exceeds the above upper limit, the amount of gas that is generated from the low-melting glass 300 during the main baking may increase depending on circumstances. As a result, a lot of gas may be generated in the storage space 3, and the performance of the electronic component 500 may degrade. On the other hand, if the thickness of the low-melting glass 300 is less than the above lower limit, depending on circumstances, the gap materials 310 may become obstacles, the low-melting glass 300 may not sufficiently get wet or spread to the lid substrate 200 side, and the base substrate 100 and the lid substrate 200 cannot be airtightly joined together.

Figure 5C:
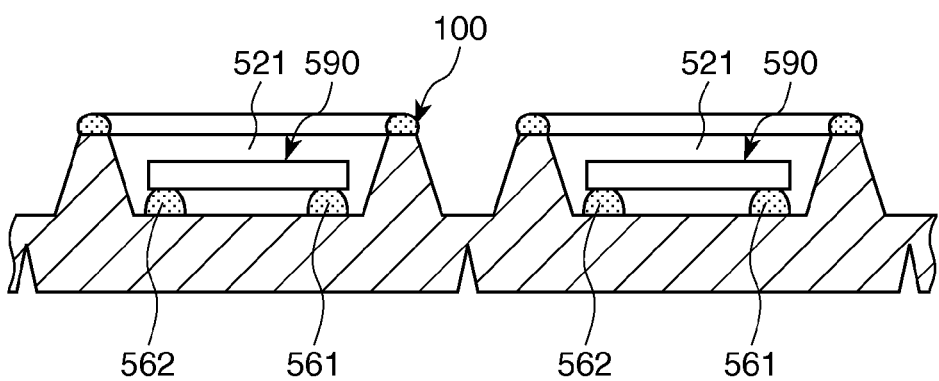

Next, as illustrated in FIG. 5C, one vibrating element 590 is mounted on each recess 521. If one recess 521 is representatively described, the vibrating element 590 is fixed to the pair of connection electrodes 541 and 551 provided in the recess 521 via the pair of conductive adhesives 561 and 562 at the bonding pads 593b and 595b. This brings about a state where the vibrating element 590 is cantilevered by the base substrate 520 in each recess 521.

Lid Substrate Placing Step

Figure 6A:
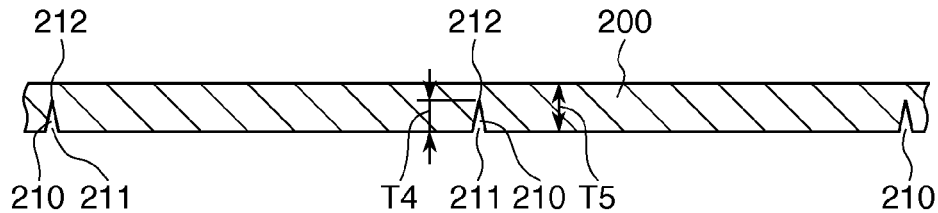
FIGS. 6A to 6C are cross-sectional views for describing the method for manufacturing an electronic component related to the first embodiment of the invention.

First, as illustrated in FIG. 6A, the lid substrate 200 prepared in the aforementioned substrate preparing step is prepared.

As mentioned above, the lid substrate 200 is formed with the grid-like grooves 210 that open to the lower surface of the lid substrate. Each groove 210 is a groove for singulation. Such a groove 210 is formed so as to overlap the groove 150 in a plan view in a state where the lid substrate 200 and the base substrate 100 are boned together (the state of a laminate 400 to be described below). In other words, the groove 210 is formed so that an opening 211 thereof faces the opening of the groove 150. Thereby, during singulation to be described below, a crack can be made from a bottom portion (top portion) 212 of the groove 210.

Additionally, although the cross-sectional shape of the groove 210 is not particularly limited, it is preferable that at least the bottom portion 212 be pointed. In addition, the above "pointed" means that the width of the bottom portion 212 is, for example, equal to or less than 10 μm. The groove 210 of the present embodiment is a substantially V-shaped groove.

Additionally, although the depth T4 of the groove 210 is not particularly limited, it is preferable that the depth be equal to or more than 50% of the thickness T5 of the lid substrate 200. Additionally, although the upper limit of the depth T4 is not particularly limited, it is preferable that the upper limit be about 90% of the thickness T5 of the lid substrate 200 if the mechanical strength of the lid substrate 200 is taken into consideration. That is, it is preferable to satisfy the relationship that is $0.5T5 \leq T4 \leq 0.9T5$. Thereby, the separation distance between the bottom portion 212 of the groove 210 and the upper surface of the lid substrate 200 becomes sufficiently short, and a crack that is made from the groove 210 can be more reliably and rapidly made to reach the upper surface of the lid substrate 200. Therefore, singulation to be described below can be reliably performed.

Figure 6B:
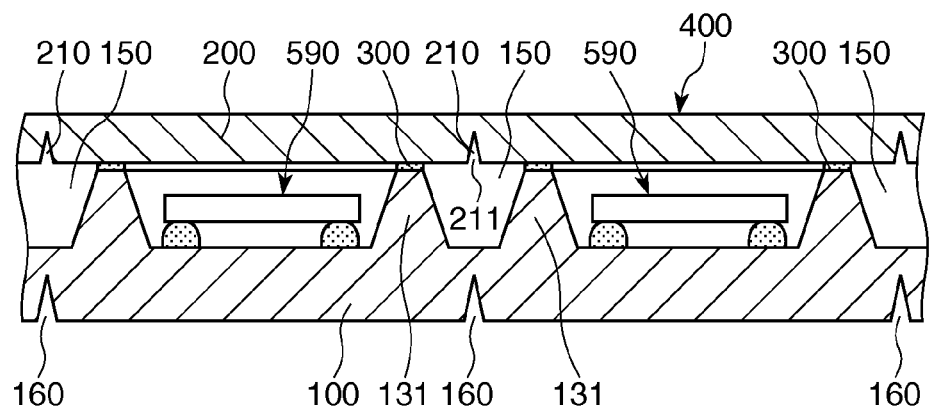

Next, as illustrated in FIG. 6B, the lid substrate 200 is placed on the upper surface of the base substrate 100 such that the surface thereof formed with the grooves 210 is turned to the base substrate 100. Thereby, a laminate 400 in which the low-melting glass 300 is interposed between the base substrate 100 and the lid substrate 200 is obtained. In such a laminate 400, respective pieces of low-melting glass 300 coated on the upper surfaces of the respective protrusions 131 are independent from each other because the adjacent protrusions 131 are sufficiently spaced apart from each other. That is, in the laminate 400, two pieces of low-melting-glass 300 coated on a pair of adjacent protrusions 131 are present in non-contact with each other. Additionally, each low-melting glass 300 is also present in non-contact with the groove 210.

Pressure-Reducing Step

For example, the laminate 400 is arranged in a chamber (not illustrated) in a state where the laminate is pinched by a jig (vise) that is not illustrated and then, the inside of the camber is pressure-reduced (preferably vacuumed). This pressure-reduces the inside of each recess 521 within the laminate 400 (preferably vacuumed). In addition, since the low-melting glass 300 has a free shape in a temporary baking stage, gas within each recess 521 easily moves into the chamber via the low-melting glass 300.

Melting Step

Next, the laminate 400 is heated and the low-melting glass 300 is melted. Thereby, the base substrate 100 and the lid substrate 200 are joined together via the low-melting glass 300, and each recess 521 is airtightly sealed.

The laminate 400 in which a plurality of the electronic components 500 are arranged in a matrix is obtained by the above processes. In such a laminate 400, the bottom portion 161 of the groove 160 arranged in the base substrate 100 and the groove 210 arranged in the lid substrate 200 at least partially overlap the bottom surface 153 of the recess 150 in a plan view in the thickness direction of the laminate 400, respectively.

Singulating Step

Figure 6C:
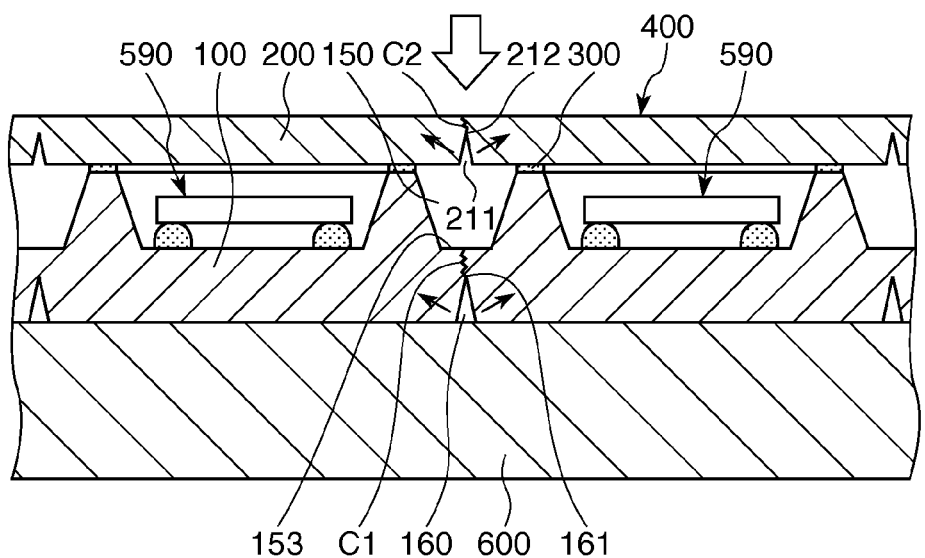
Figure 7A:
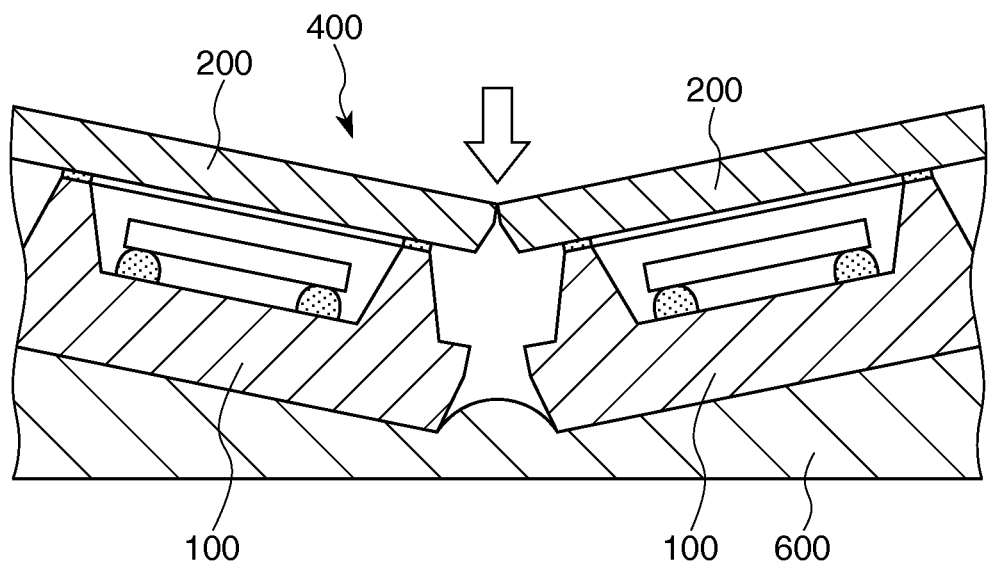
FIGS. 7A and 7B are cross-sectional views for describing the method for manufacturing an electronic component related to the first embodiment of the invention.
Figure 7B:
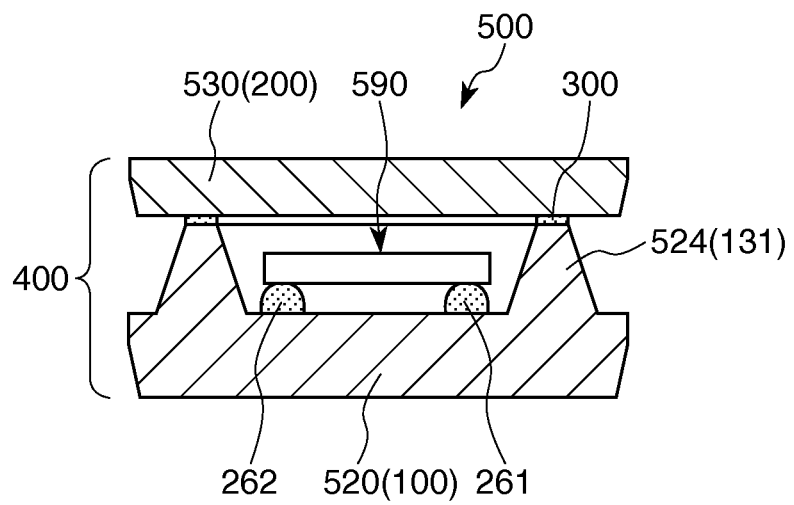

Next, the plurality of electronic components 500 contained in the laminate 400 are singulated. For example, as illustrated in FIGS. 6C and 7A, the laminate 400 is placed on a soft sheet 600, such as a sponge sheet, with the base substrate 100 being placed downward. Then, the laminate 400 is locally pressed from above. Then, the base substrate 100 is deformed (is deformed in the direction of an arrow in the drawing) so as to expand the opening of the groove 160. Thereby, a crack C1 is created from the bottom portion 161, and the crack C1 reaches the bottom surface 153 of the groove 150. Moreover, the lid substrate 200 is deformed (is deformed in the direction of an arrow in the drawing) so as to expand the opening of the groove 210. Thereby, a crack C2 is created from the bottom portion 212, and the crack C2 reaches the upper surface of the lid substrate 200. Thereby, as illustrated in FIG. 7B, the electronic component 500 contained in the laminate 400 is singulated along the grooves 160 and 210.

Such singulation can be simply performed, for example, by rolling a roller on the upper surface of the laminate 400 while biasing the roller downward (the laminate 400 side). Specifically, the above-described singulation can be simply performed by first rolling the roller in a first direction along the formation direction of the grooves 150, 160, and 210, and next rolling the roller in a second direction orthogonal to the first direction.

The method for manufacturing the electronic component 500 has been described above.

According to such a manufacturing method, grooves serving as starting points of cracks, which are the grooves 160 and 210 for singulation, are formed in both the base substrate 100 and the lid substrate 200. Therefore, generation locations of the cracks can be reliably controlled and the laminate 400 can be simply singulated with high precision. Additionally, along with this, the yield rate of the electronic components 500 improves. Particularly, in the laminate 400, the grooves 160 and 210 are turned to the same direction (for example, upper side in FIGS. 6A and 6B). Therefore, the laminate 400 can be simply singulated according to the stress from one side of the laminate 400 in the thickness direction thereof.

Additionally, in the manufacturing method of the present embodiment, the groove 150 is provided between the plurality of electronic components 500 contained in the laminate 400, and the crack C1 is configured so as to reach the bottom surface 153 of the groove 150. Therefore, the crack C1 can be reliably prevented from arriving at the electronic component 500. Additionally, since the groove 210 serving as a starting point of the crack C2 is also provided so as to overlap the groove 150, the crack C2 can be reliably prevented from arriving at the electronic component 500. Thereby, for example, cracking of the lid 530 or the base substrate 520 can be prevented, and the electronic component 500 in which mechanical strength and the airtightness of the storage space 3 are secured can be more reliably manufactured.

Additionally, in the manufacturing method of the present embodiment, the protrusion 131 serving as the side wall 524 of each electronic component 500 is separated by the groove 150 and the width W2 of the groove 150 is greatly secured, whereby the contact and integration of the low-melting glass 300, which is coated on the upper surfaces of the adjacent protrusions 131, on the lid substrate 200 are prevented. Additionally, the low-melting glass 300 is formed so as to avoid the groove 210 (that is, the low-melting glass 300 is in non-contact with the groove 210). Therefore, when the laminate 400 is singulated, a crack can be effectively prevented from being made in the low-melting glass 300.

In addition, in the present embodiment, a groove may be further formed in the bottom surface 153 of the groove 150 of the base substrate 100. In this case, it is preferable that the groove be formed so that a bottom portion (top portion) thereof faces the bottom portion 161 of the groove 160. By forming such a groove, singulation of the electronic component 500 can be simply and reliably performed so as to be equal to or better than the aforementioned method.

Second Embodiment

Next, a second embodiment of the method for manufacturing an electronic component of the invention will be described.

Figure 9A:
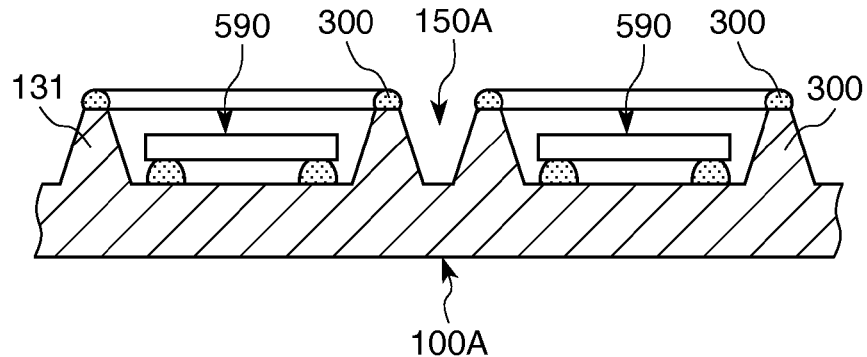
FIGS. 9A to 9C are cross-sectional views for describing the method for manufacturing an electronic component related to the second embodiment of the invention.
Figure 9B:
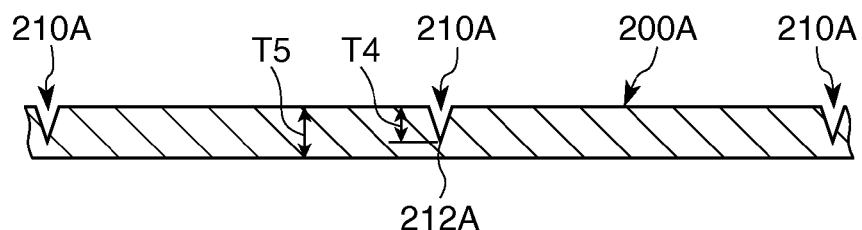
Figure 9C:
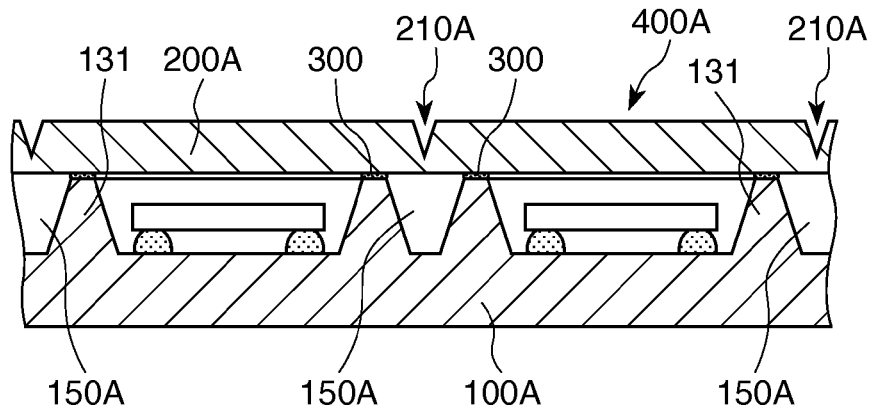
Figure 10A:
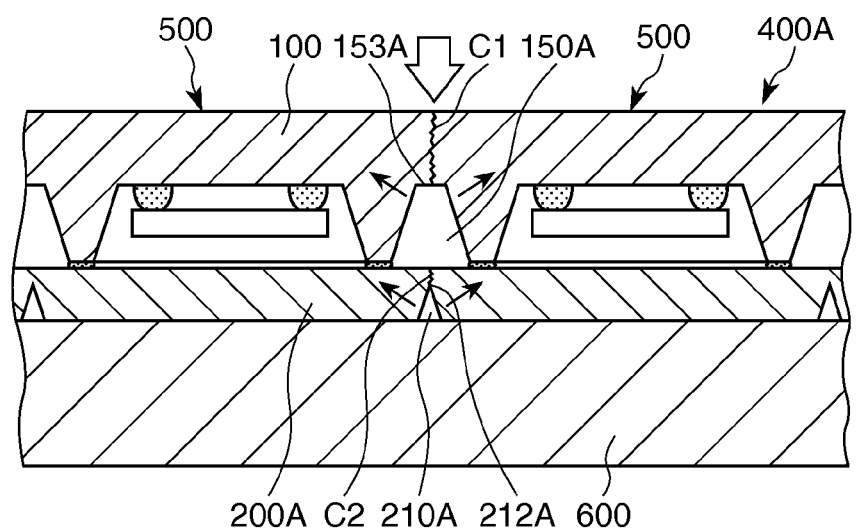
FIGS. 10A to 10C are cross-sectional views for describing the method for manufacturing an electronic component related to the second embodiment of the invention.
Figure 10B:
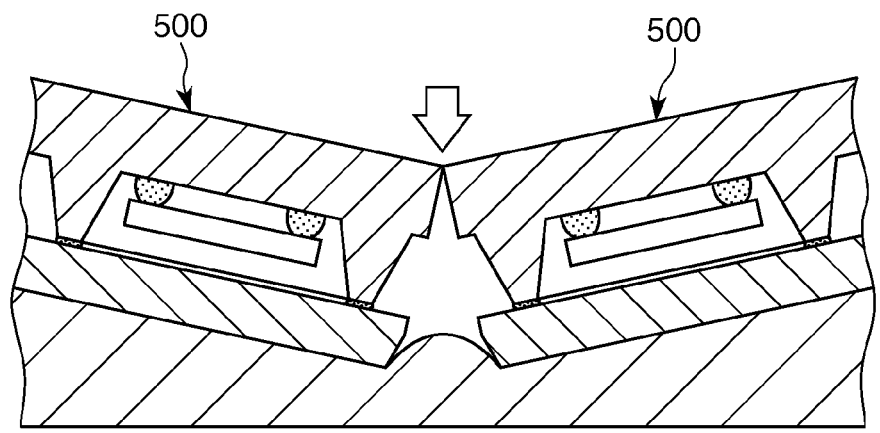
Figure 10C:
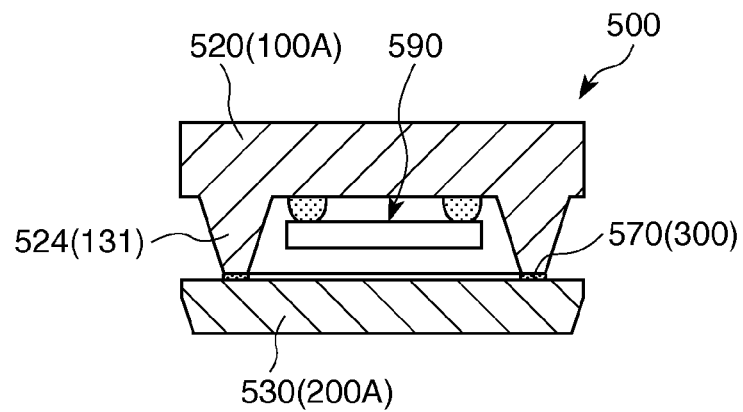
Figure 11:
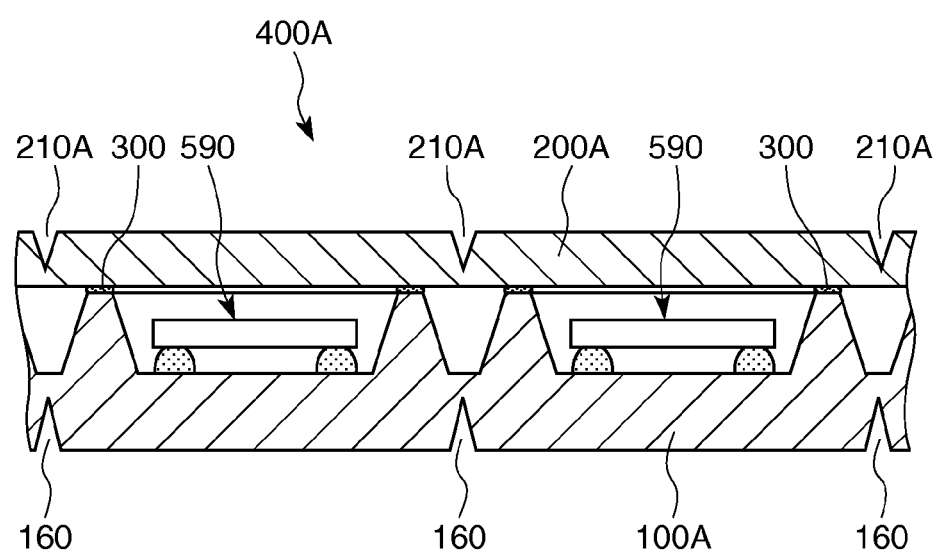
FIG. 11 is a cross-sectional view illustrating a modification example of a base substrate.

FIGS. 8A to 10C are cross-sectional views for describing the method for manufacturing an electronic component related to the second embodiment of the invention, and FIG. 11 is a cross-sectional view illustrating a modification example of the base substrate. In addition, description will be made below with the upper side in FIGS. 8A to 11 as "upper" and the lower side as "lower" for convenience of description.

In the method for manufacturing an electronic component of the second embodiment, differences from the aforementioned embodiment will be mainly described, and the description of the same matters will be omitted.

The method for manufacturing an electronic component of the second embodiment of the invention is the same as that of the aforementioned first embodiment except that the configuration (arrangement or the like) of grooves for singulation varies. In addition, the same reference numerals are given to the same components as the aforementioned first embodiment.

The method for manufacturing the electronic component 500 has a substrate preparing step, a mounting step, a lid substrate placing step, a pressure-reducing step, a melting step, and a singulating step.

Substrate Preparing Step

First, a base substrate 100A and the lid substrate 200 are prepared.

Figure 8A:
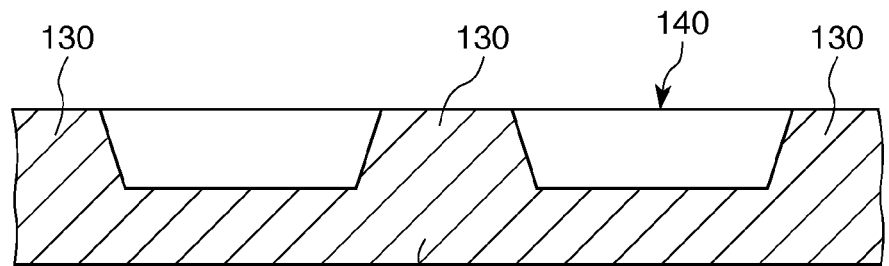
FIGS. 8A to 8D are cross-sectional views for describing a method for manufacturing an electronic component related to a second embodiment of the invention.
Figure 8B:
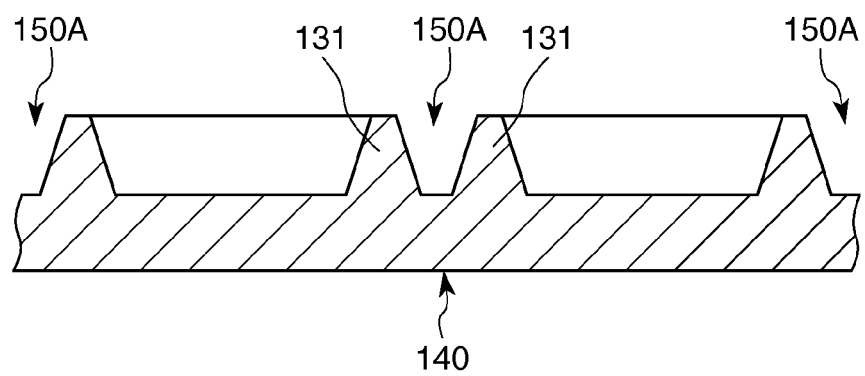
Figure 8C:
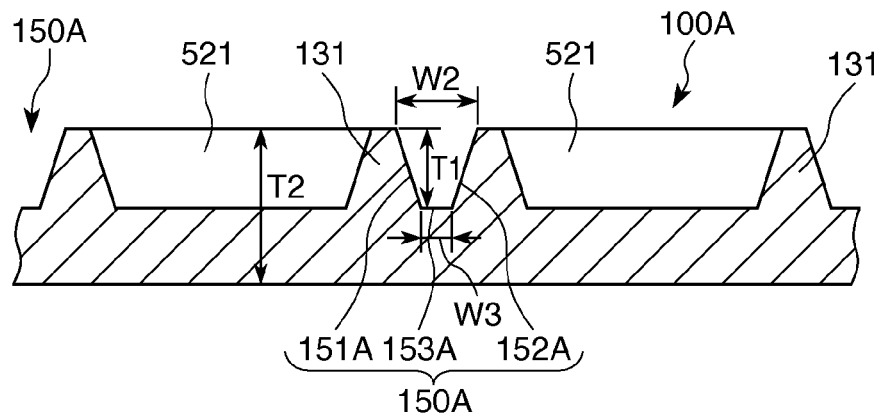

As for manufacture of the base substrate 100A, first, as illustrated in FIG. 8A, similar to the aforementioned first embodiment, the grid-like protrusions 130 are formed on the ceramic green sheet 120, and the ceramic green sheet 140 is obtained. Next, as illustrated in FIG. 8B, grid-like grooves 150A that open to the upper surfaces of the protrusions 130 are formed after various electrodes are formed. Next, as illustrated in FIG. 8C, the base substrate 100A is obtained by sintering the ceramic green sheet 140. In the base substrate 100A, the protrusions 130 are split into the plurality of frame-shaped protrusions 131 that are arranged in a matrix by the grooves 150A. Each protrusion 131 constitutes the side wall 524.

The groove 150A has a pair of side surfaces 151A and 152A, and a bottom surface 153A that couples the side surfaces 151A and 152A at lower ends thereof. Although the depth T1 of such a groove 150A is not particularly limited, it is preferable that the depth be equal to or more than 50% of the thickness T2 of the base substrate 100A. Although the upper limit of the depth T1 is not particularly limited, it is preferable that the upper limit be about 90% of the thickness T2 of the base substrate 100A if the mechanical strength of the base substrate 100A is taken into consideration. That is, it is preferable that T1 and T2 satisfy the relationship that is $0.5T2 \leq T1 \leq 0.9T2$. Thereby, the separation distance between a bottom surface 153A of the groove 150A and the lower surface of the base substrate 100A becomes sufficiently short, and a crack that is made from the groove 150A can be more reliably and rapidly made to reach the lower surface of the base substrate 100A. Therefore, singulation to be described below can be reliably performed.

Although the width W2 of the opening of the groove 150A is not particularly limited, it is preferable that the width be from about 10 μm to about 200 μm. Although the low-melting glass 300 is coated on the upper surface of each protrusion 131 in steps to be described below, the upper surfaces of the adjacent protrusions 131 can be necessarily and sufficiently spaced apart from each other by adopting the numerical ranges as described above. Therefore, during a manufacturing step, a non-contact state between the low-melting glass 300 coated on the upper surface of one protrusion 131 and the low-melting glass 300 coated on the upper surface of the other protrusion 131 can be maintained.

Additionally, although the width W3 of the bottom surface 153A of the groove 150A is not particularly limited, it is so preferable that the width be smaller, specifically, it is preferable that the width be equal to or less than 10 μm. Thereby, since a crack can be made from the bottom surface 153A of the groove 150A, in other words, since a place where a crack is made can be controlled with high precision, singulation can be more reliably performed.

Figure 8D:
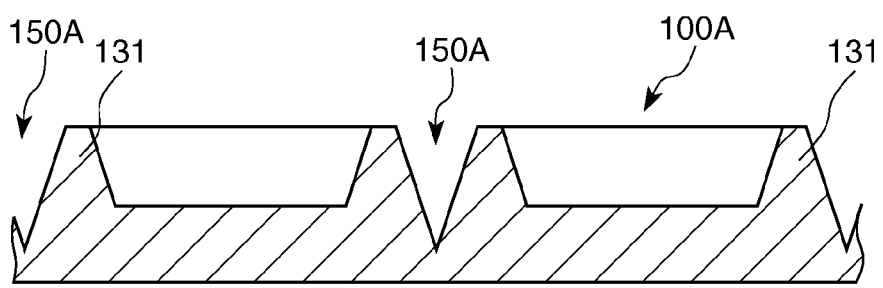

In addition, the bottom surface 153A may be omitted. That is, as illustrated in FIG. 8D, the width W3 may be 0 μm, and the groove 150A may be a substantially V-shaped groove having a pointed tip. By adopting such a shape, the above-described effects become more remarkable.

On the other hand, the lid substrate 200 is manufactured similarly to the aforementioned base substrate 100. That is, the lid substrate is obtained by first preparing a ceramic green sheet obtained by forming the mixture 110 in the shape of a sheet by the doctor blade method or the like, by forming grid-like grooves 210A in one surface of the ceramic green sheet, and then baking the ceramic green sheet. In addition, the grooves 210A will be described below in detail.

Mounting Step

Since the mounting step is the same as the mounting step of the aforementioned first embodiment, description thereof is omitted.

Lid Substrate Placing Step

First, as illustrated in FIG. 9B, a lid substrate 200A is prepared. As mentioned above, the lid substrate 200A is formed with the grid-like grooves 210A that open to the upper surface of the lid substrate. Each groove 210A is a groove for singulation. Such a groove 210A is formed so as to overlap the groove 150A, that is, so that a bottom portion (top portion) 212A thereof is located inside the opening of the groove 150A, in a plan view in a state where the lid substrate 200A and the base substrate 100A are joined together (the state of a laminate 400A to be described below). In other words, the bottom portion 212A is formed so as to face the opening of the groove 150A. Thereby, during singulation to be described below, a crack that is made from the groove 210A can be more reliably guided to the opening of the groove 150A.

Although the cross-sectional shape of the groove 210A is not particularly limited, it is preferable that at least the bottom portion 212A be pointed. In addition, the above "pointed" means that the width of the bottom portion 212A is, for example, equal to or less than 10 μm. The groove 210A of the present embodiment is a substantially V-shaped groove.

Additionally, although the depth T4 of the groove 210A is not particularly limited, it is preferable that the depth be equal to or more than 50% of the thickness T5 of the lid substrate 200. Although the upper limit of the depth T4 is not particularly limited, it is preferable that the upper limit be about 90% of the thickness T5 of the lid substrate 200A if the mechanical strength of the lid substrate 200A is taken into consideration. That is, it is preferable that T4 and T5 satisfy the relationship that is $0.5T5 \leq T4 \leq 0.9T5$. Thereby, the separation distance between the bottom portion 212A of the groove 210A and the lower surface of the lid substrate 200A becomes sufficiently short, and a crack that is made from the groove 210A can be more reliably and rapidly made to reach the lower surface of the lid substrate. Therefore, singulation to be described below can be reliably performed.

Next, as illustrated in FIG. 9C, the lid substrate 200A is placed on the upper surface of the base substrate 100A such that the surface thereof that is not formed with the grooves 210A is turned to the base substrate 100A. Thereby, the laminate 400A is obtained. In such a laminate 400A, as mentioned above, respective pieces of low-melting glass 300 coated on the upper surfaces of the respective protrusions 131 are independent from each other because the adjacent protrusions 131 are sufficiently spaced apart. That is, in the laminate 400A, two pieces of low-melting glass 300 coated on a pair of adjacent protrusions 131 are present in non-contact with each other. Additionally, each low-melting glass 300 is also present in non-contact with the groove 210A.

Pressure-Reducing Step

Since the pressure-reducing step is the same as the pressure-reducing step of the aforementioned first embodiment, description thereof is omitted.

Melting Step

Since the melting step is the same as the melting step of the aforementioned first embodiment, description thereof is omitted.

Singulating Step

Next, the plurality of electronic components 500 contained in the laminate 400A are singulated. For example, as illustrated in FIGS. 10A and 10B, the laminate 400A is placed on the soft sheet 600, such as a sponge sheet, with the lid substrate 200A being turned down. Then, the laminate 400A is locally pressed from above. Then, the lid substrate 200A is deformed (is deformed in the direction of an arrow in the drawing) so as to expand the opening of the groove 210A. Thereby, a crack C2 is created from the bottom portion 212A of the groove 210A, and the crack C2 reaches the upper surface of the lid substrate 200A and the inside of the opening of the groove 150A. Moreover, the base substrate 100A is deformed (is deformed in the direction of an arrow in the drawing) so as to expand the opening of the groove 150A. Thereby, a crack C1 is created from the bottom surface 153A of the groove 150A, and the crack C1 reaches the upper surface of the base substrate 100A. Thereby, as illustrated in FIG. 10C, the electronic component 500 contained in the laminate 400A is singulated.

The method for manufacturing the electronic component 500 has been described above.

The same effects as the aforementioned first embodiment can also be exhibited by such a second embodiment.

Here, as illustrated in FIG. 11, the grooves 160 may be formed in the lower surface (surface opposite to the grooves 150A) of the base substrate 100. Thereby, the singulation can be more simply and reliably performed.

Third Embodiment

Next, a third embodiment of the method for manufacturing an electronic component of the invention will be described.

Figure 12:
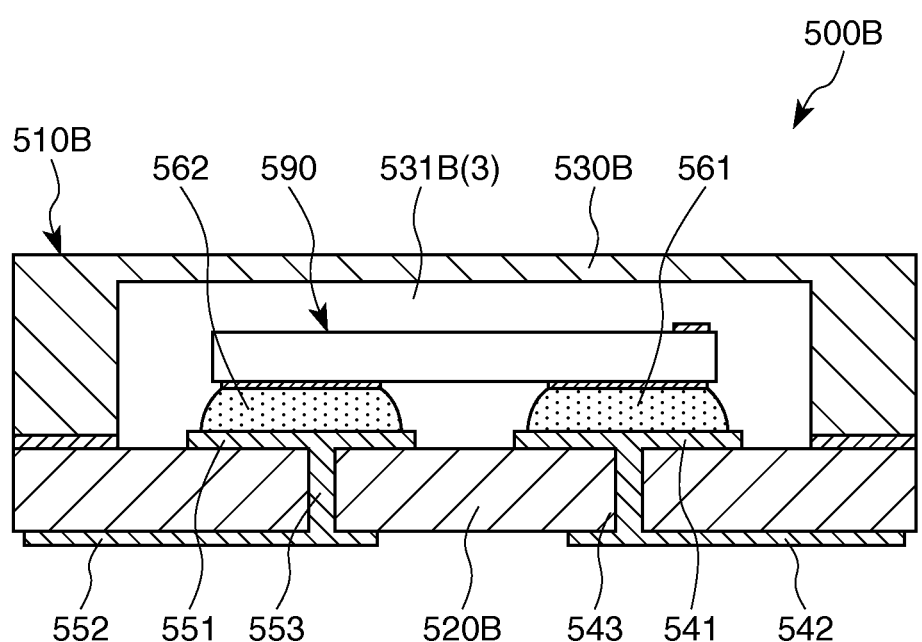
FIG. 12 is a cross-sectional view illustrating an electronic component manufactured by a method for manufacturing an electronic component related to a third embodiment of the invention.

FIG. 12 is a cross-sectional view illustrating an electronic component manufactured by a method for manufacturing an electronic component related to a third embodiment of the invention, and FIGS. 13A to 15B are cross-sectional views for describing the method for manufacturing an electronic component related to the third embodiment of the invention. In addition, description will be described below with the upper side in FIGS. 12A to 15B as "upper" and the lower side as "lower" for convenience of description.

The method for manufacturing an electronic component of the third embodiment will be described mainly about differences from the aforementioned embodiments, and the description of the same matters will be omitted.

The method for manufacturing an electronic component of the third embodiment of the invention is the same as that of the aforementioned first embodiment except that the configurations of the base substrate and the lid substrate vary. In addition, the same reference numerals are given to the same components as the aforementioned first embodiment.

1. Electronic Component

As illustrated in FIG. 12, in a package 510B that an electronic component 500B has, a plate-shaped base substrate 520B, and a lid-shaped lid 530B that has a recess 531B that opens to a lower surface of the base substrate are joined together at low-melting glass 570. Fracture surfaces are present in respective side surfaces of the base substrate 520B and the lid 530B. The airtight storage space 3 is formed as the opening of the recess 531B is blocked by the base substrate 520B. According to such a configuration, the configuration of the package 510 becomes simple.

2. Method for Manufacturing Electronic Component

The method for manufacturing the electronic component 500B has a substrate preparing step, a mounting step, a lid substrate placing step, a pressure-reducing step, a melting step, and a singulating step.

Substrate Preparing Step

First, a base substrate 100B and a lid substrate 200B are prepared.

The base substrate 100B has a plate shape and has grid-like grooves 150B formed in the upper surface thereof. In such a base substrate 100B, a plurality of regions (singulation regions) partitioned by the grid-like grooves 150B form the base substrates 520B, respectively.

Figure 13A:
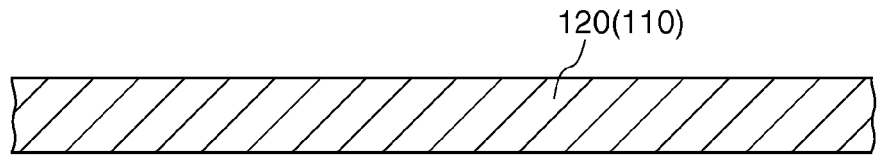
FIGS. 13A to 13E are cross-sectional views for describing the method for manufacturing an electronic component related to the third embodiment of the invention.
Figure 13B:
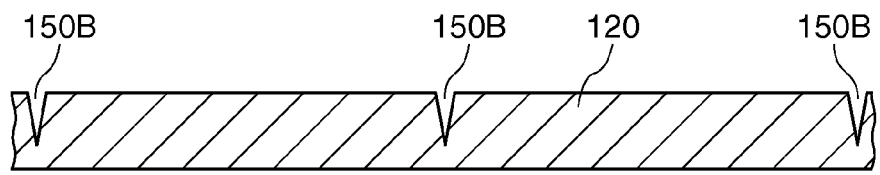
Figure 13C:
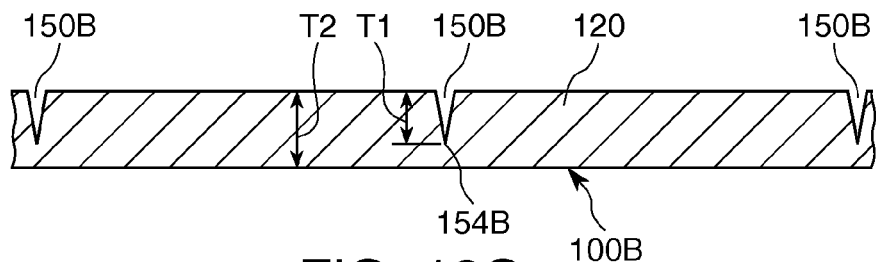

As for manufacture of the base substrate 100B, first, as illustrated in FIG. 13A, the ceramic green sheet 120 in which the mixture 110 is formed in the shape of a sheet by the doctor blade method or the like is prepared. Next, as illustrated in FIG. 13B, the grid-like grooves 150B that open to the upper surface of the ceramic green sheet 120 are formed, for example, by knife cutting or the like. Next, various electrodes (the connection electrodes, the external mounting electrodes, and the through electrodes) are formed similar to the aforementioned first embodiment. Next, the ceramic green sheet 120 is sintered. Thereby, as illustrated in FIG. 13C, the base substrate 100B is obtained.

Although the cross-sectional shape of the groove 150B is not particularly limited, it is preferable that at least a bottom portion 154B be pointed. In addition, the above "pointed" means that the width of the bottom portion 154B is, for example, equal to or less than 10 μm. The groove 150B of the present embodiment is a substantially V-shaped groove.

Additionally, although the depth T1 of the groove 150B is not particularly limited, it is preferable that the depth be a value that is equal to or more than 50% of the thickness T2 of the base substrate 100B. Although the upper limit of the depth T1 is not particularly limited, it is preferable that the upper limit be about 90% of the thickness T2 of the base substrate 100B if the mechanical strength of the base substrate 100B is taken into consideration. That is, it is preferable that T1 and T2 satisfy the relationship that is $0.5T2 \leq T1 \leq 0.9T2$. Thereby, the separation distance between a bottom portion 154B of the groove 150B and the lower surface of the base substrate 100B becomes sufficiently short, and a crack that is made from the groove 150B can be more reliably and rapidly made to reach the lower surface of the base substrate 100B. Therefore, singulation to be described below can be reliably performed.

Figure 13D:
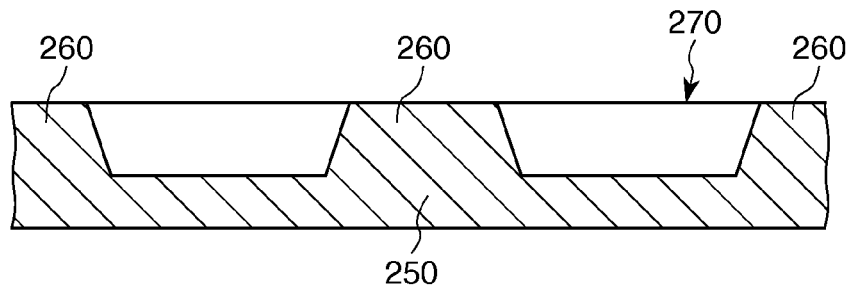
Figure 13E:
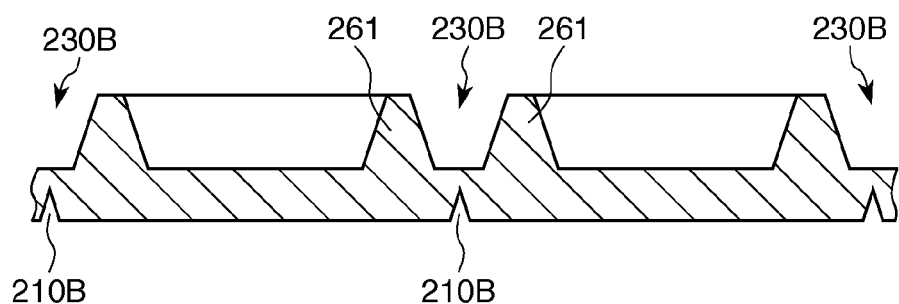
Figure 14A:
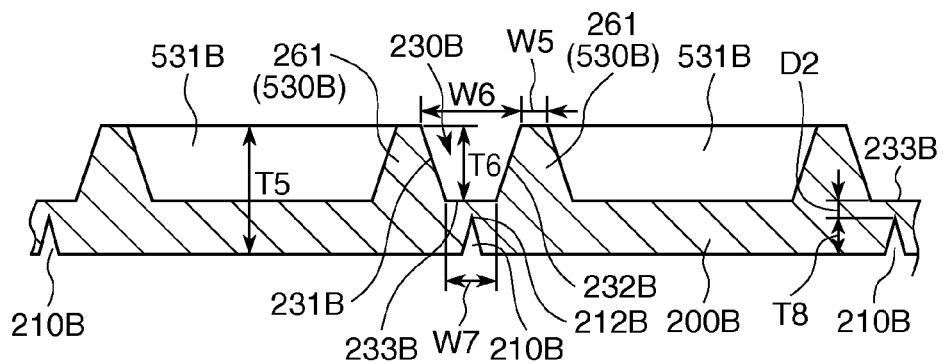
FIGS. 14A to 14C are cross-sectional views for describing the method for manufacturing an electronic component related to the third embodiment of the invention.
Figure 14B:
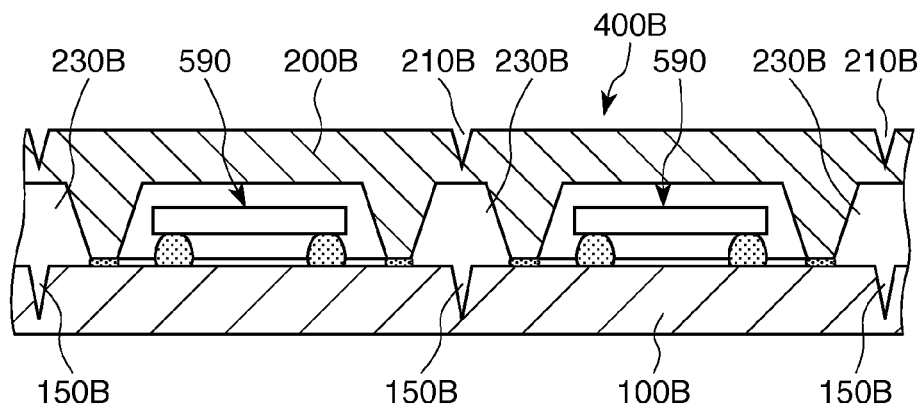

On the other hand, the lid substrate 200B has the same shape as the base substrate 100 of the aforementioned first embodiment. Therefore, the lid substrate 200B can be formed similar to the base substrate 100. To describe briefly, first, as illustrated in FIG. 13D, a ceramic green sheet 270 in which grid-like protrusions 260 are formed on the ceramic green sheet 250 formed with various electrodes (not illustrated) is obtained. Next, as illustrated in FIG. 13E, grid-like grooves (recesses) 230B that open to the upper surfaces (top surface) of the protrusions 260, and grid-like grooves 210B that open to the lower surface of the ceramic green sheet 270 are formed. Next, as illustrated in FIG. 14A, the lid substrate 200B is obtained by sintering the ceramic green sheet 270.

In the lid substrate 200B, the protrusions 260 are split into a plurality of frame-shaped protrusions 261 that are arranged in a matrix by forming the grooves (recesses) 230B. Each of the split protrusions 261 constitutes the side wall of the lid 530, and the vibrating element 590 is stored inside (that is, recess 531B) the protrusion. In other words, the lid substrate 200B has the plurality of frame-shaped protrusions 261 that protrude upward and allow the vibrating element 590 to be stored in each thereof, and the grooves (recesses) 230B each of which is located between a pair of adjacent protrusions 261.

Although the width W5 of the upper surface of each protrusion 261 is not particularly limited, it is preferable that the width be within a range from about 50 μm to about 200 μm. As will be described below, the low-melting glass 300 is coated on the upper surface of each protrusion 261, and the base substrate 100B and the lid substrate 200B are joined together via the low-melting glass 300. By setting the width W5 to the aforementioned range, a contact surface (coating surface of the low-melting glass) with the low-melting glass 300 can be sufficiently secured while preventing the protrusion 261 from becoming excessively thick, and the base substrate 100B and the lid substrate 200B can be joined together with sufficient strength.

The groove 230B has a pair of side surfaces 231B and 232B, and a bottom surface 233B that couples the side surfaces 231B and 232B together at lower ends thereof. The side surfaces 231B and 232B form inclined surfaces that incline with respect to the normal line of the lid substrate 200B, respectively, and the width of the groove 230B decreases gradually from the opening toward the bottom surface 233B. That is, the groove 230B has a substantially trapezoidal cross-sectional shape.

Additionally, although the depth T6 of the groove 230B is not particularly limited, it is preferable that the depth be from about 50 μm to about 200 μm. Additionally, it is preferable that the depth T6 be equal to or more than 50% of the thickness T5 of the lid substrate 200B. That is, it is preferable that T5 and T6 satisfy the relationship that is $T6 \geq T5/2$.

Although the width W6 of the opening of the groove 230B is not particularly limited, it is preferable that the width be from about 10 μm to about 200 μm. Although the low-melting glass 300 is coated on the upper surface of each protrusion 261 in steps to be described below, the upper surfaces of the adjacent protrusions 261 can be necessarily and sufficiently spaced apart from each other by adopting the numerical ranges as described above. Therefore, during a manufacturing step, a non-contact state between the low-melting glass 300 coated on the upper surface of one protrusion 261 and the low-melting glass 300 coated on the upper surface of the other protrusion 261 can be maintained.

Although the width W7 of the bottom surface 233B of the groove 230B is not particularly limited, it is preferable that the width be from about 20 μm to about 100 μm. Thereby, the width of the bottom surface 233B is necessarily and sufficiently obtained, and during singulation to be described below, a crack that is made using the groove 210B as a trigger can be more reliably guided to the bottom surface 233B.

On the other hand, the groove 210B is formed so that a bottom portion (top portion) 212B thereof overlaps the bottom surface 233B of the groove 230B in a plan view of the lid substrate 200B. In other words, the groove 210B is formed so that a bottom portion (top portion) 211B thereof faces the bottom surface 233B in the thickness direction. Thereby, during singulation to be described below, a crack that is made from the groove 210B can be more reliably guided to the bottom surface 233B.

Additionally, although the cross-sectional shape of the groove 210B is not particularly limited, it is preferable that at least a bottom portion 212B be pointed. In addition, the above "pointed" means that the width of the bottom portion 212B is, for example, equal to or less than 10 µm. The groove 210B of the present embodiment is a substantially V-shaped groove.

Additionally, although the depth T8 of the groove 210B is not particularly limited, it is preferable that the depth be a value such that the separation distance D2 from the bottom surface 233B is equal to or less than 30% of the thickness T5 of the lid substrate 200B. That is, it is preferable that the depth T8 satisfy the relationship that is (T6+T8)/T5≤0.7. By making the groove 210B have such a depth, during singulation to be described below, a crack that is made using the groove 210B as a trigger can be more reliably guided to the bottom surface 233B.

Mounting Step

First, the low-melting glass 300 in a liquid state is coated over the whole circumference of the upper surface of each protrusion 261 of the lid substrate 200B, and is temporarily baked. Next, the vibrating element 590 is mounted within each region partitioned by the groove 160B.

Lid Substrate Placing Step

The lid substrate 200B is placed on the base substrate 100B. Thereby, a laminate 400B is obtained. Here, in the laminate 400B, one vibrating element 590 is covered with one frame-shaped protrusion 261. Additionally, in the laminate 400B, the groove 150B is formed so as to overlap the groove 230B. Specifically, the groove 150B is formed so that the opening thereof communicates with (faces) the opening of the groove 230B. Thereby, during singulation to be described below, a crack can be made from the bottom portion 154B of the groove 150B.

That is, in the laminate 400B, the bottom portion 154B of the groove 150B arranged in the base substrate 100 and the groove 210B arranged in the lid substrate 200 at least partially overlap the bottom surface 233B of the groove 230B in a plan view in the thickness direction of the laminate 400B, respectively.

Pressure-Reducing Step

Since the pressure-reducing step is the same as the pressure-reducing step of the aforementioned first embodiment, description thereof is omitted.

Melting Step

Since the melting step is the same as the melting step of the aforementioned first embodiment, description thereof is omitted.

Singulating Step

Figure 14C:
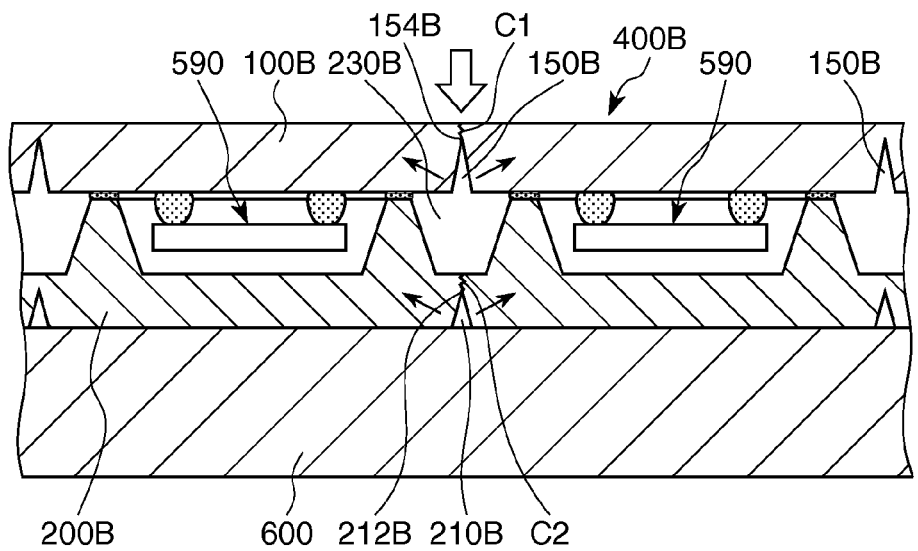
Figure 15A:
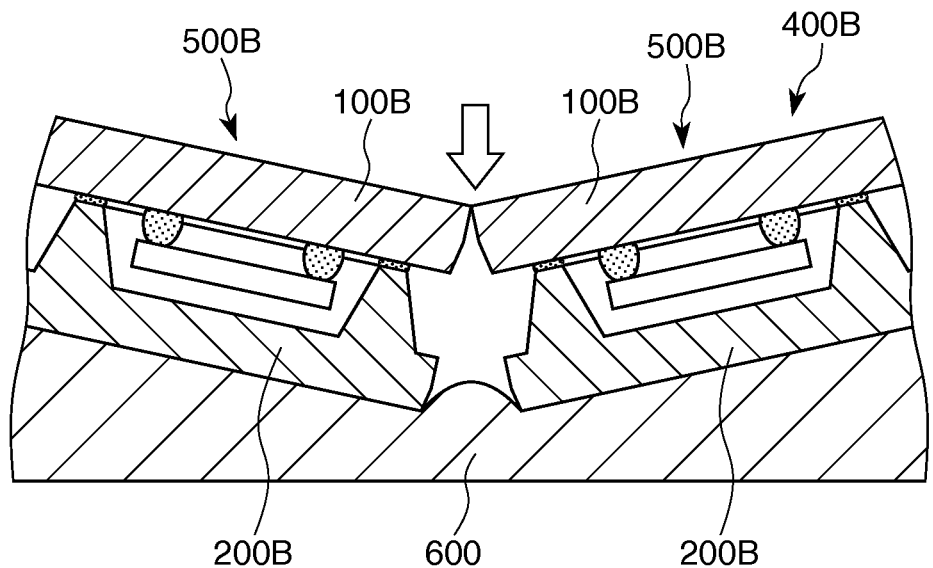
FIGS. 15A and 15B are cross-sectional views for describing the method for manufacturing an electronic component related to the third embodiment of the invention.
Figure 15B:
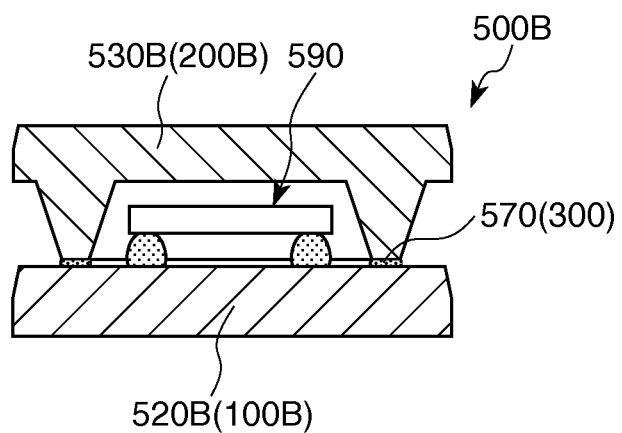

Next, the plurality of electronic components 500B contained in the laminate 400B are singulated. For example, as illustrated in FIGS. 14C and 15A, the laminate 400B is placed on the soft sheet 600, such as a sponge sheet, with the lid substrate 200B being turned down. Then, the laminate 400B is locally pressed from above. Then, the lid substrate 200B is deformed (is deformed in the direction of an arrow in the drawing) so as to expand the opening of the groove 210B. Thereby, a crack C2 is created from the bottom portion 212B, and the crack C2 reaches the bottom surface 233B of the groove 230B. Moreover, the base substrate 100B is deformed (is deformed in the direction of an arrow in the drawing) so as to expand the opening of the groove 150B. Thereby, a crack C1 is created from the bottom portion 154B of the groove 150B, and the crack C1 reaches the upper surface of the base substrate 100B. Thereby, as illustrated in FIG. 15B, the electronic component 500B contained in the laminate 400B is singulated. In addition, as for the generation order of the cracks C1 and C2, any one of the cracks may be first generated, or both the cracks may be simultaneously generated.

The method for manufacturing the electronic component 500B has been described above.

The same effects as the aforementioned first embodiment can also be exhibited by such a third embodiment.

Fourth Embodiment

Next, a fourth embodiment of the method for manufacturing an electronic component of the invention will be described.

Figure 17A:
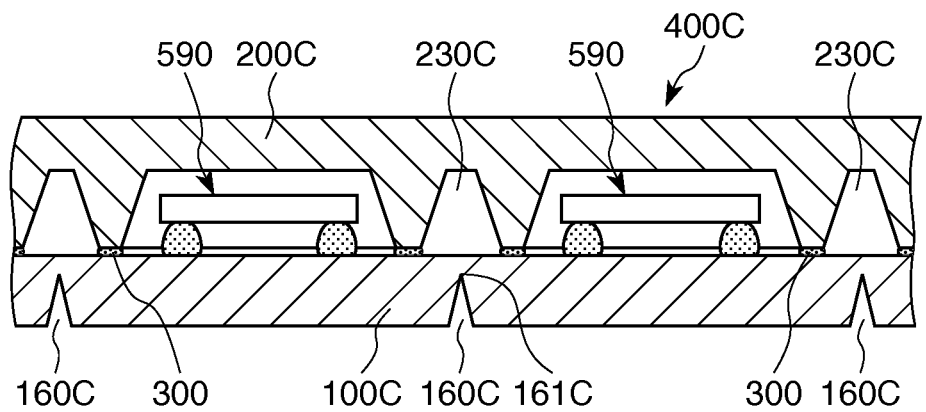
FIGS. 17A and 17B are cross-sectional views for describing the method for manufacturing an electronic component related to the fourth embodiment of the invention.
Figure 17B:
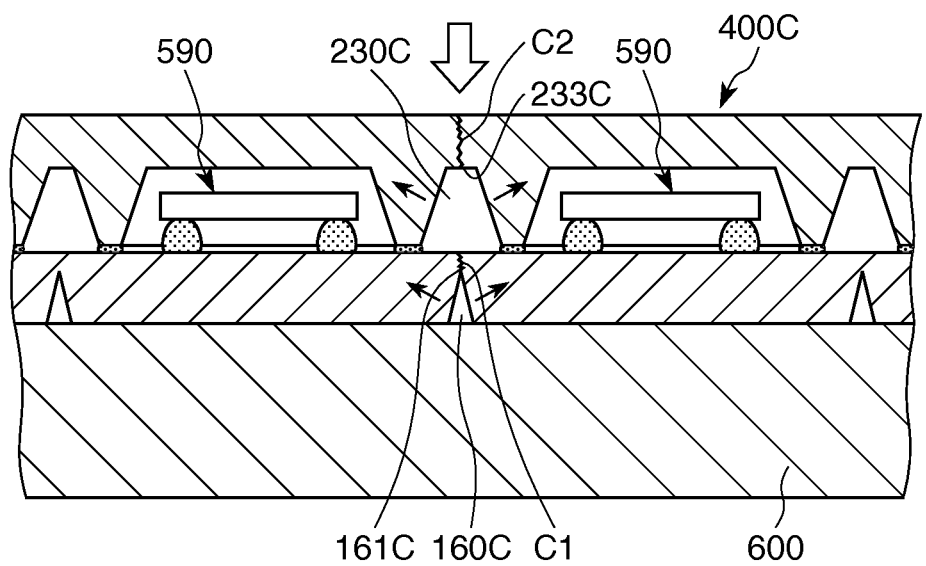
Figure 18A:
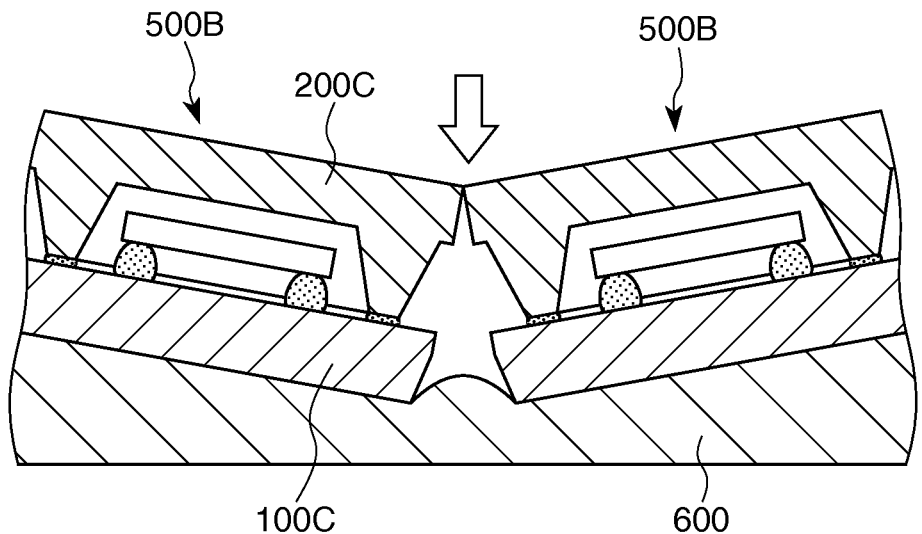
FIGS. 18A and 18B are cross-sectional views for describing the method for manufacturing an electronic component related to the fourth embodiment of the invention.
Figure 18B:
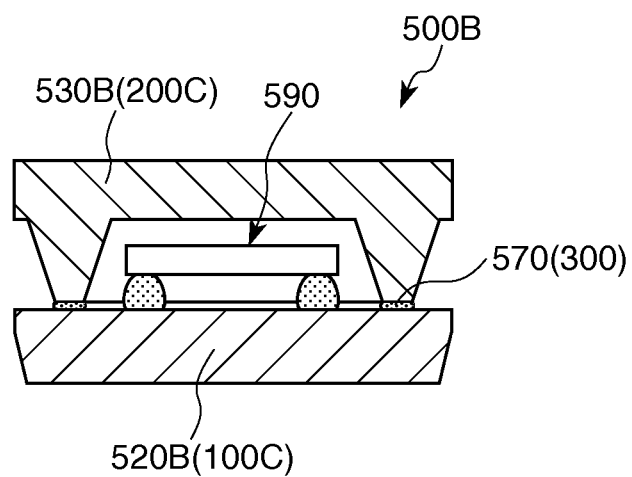
Figure 19:
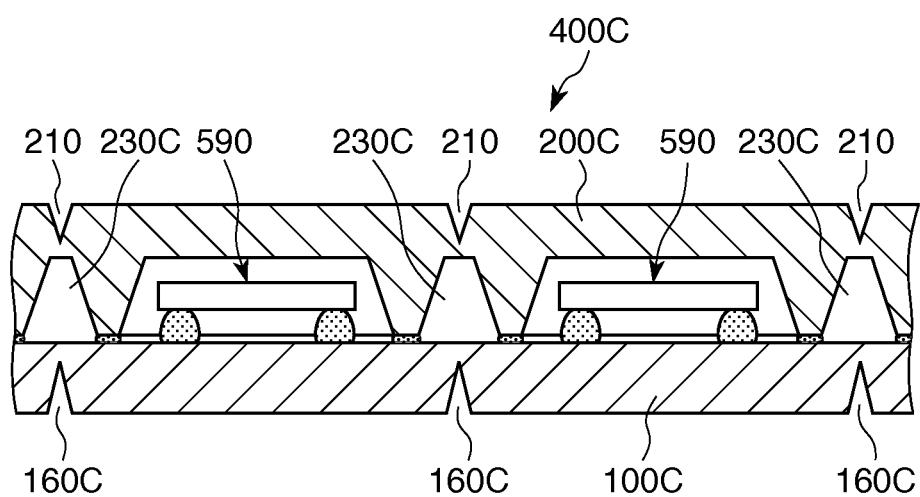
FIG. 19 is a cross-sectional view illustrating a modification example of a lid substrate.

FIGS. 16A to 18B are cross-sectional views for describing the method for manufacturing an electronic component related to the fourth embodiment of the invention, and FIG. 19 is a cross-sectional view illustrating a modification example of the lid substrate. In addition, description will be described below with the upper side in FIGS. 16A to 19 as "upper" and the lower side as "lower" for convenience of description.

The method for manufacturing an electronic component of the fourth embodiment will be described mainly about differences from the aforementioned embodiment, and the description of the same matters will be omitted.

The method for manufacturing an electronic component of the fourth embodiment of the invention is the same as that of the aforementioned first embodiment except that the configuration (arrangement or the like) of grooves for singulation varies. In addition, the same reference numerals are given to the same components as the aforementioned first embodiment.

The method for manufacturing the electronic component 500B has a substrate preparing step, a mounting step, a lid substrate placing step, a pressure-reducing step, a melting step, and a singulating step.

Substrate Preparing Step

First, a base substrate 100C and a lid substrate 200C are prepared.

Figure 16A:
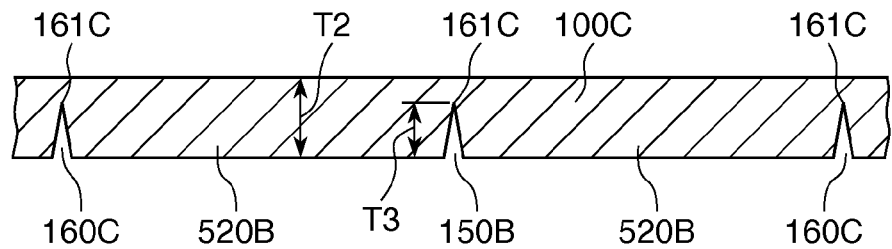
FIGS. 16A to 16D are cross-sectional views for describing a method for manufacturing an electronic component related to a fourth embodiment of the invention.

As illustrated in FIG. 16A, the base substrate 100C is formed with grid-like grooves 160C that open to the lower surface of the base substrate. In such a base substrate 100C, a plurality of regions (singulation regions) partitioned by the grid-like grooves 160C form the base substrates 520B, respectively.

Each groove 160C is a groove for singulation. Although the cross-sectional shape of the groove 160C is not particularly limited, it is preferable that at least a bottom portion 161C be pointed. The above "pointed" means that the width of the bottom portion 161C is, for example, equal to or less than 10 µm. The groove 160C of the present embodiment is a substantially V-shaped groove.

Additionally, although the depth T3 of the groove 160C is not particularly limited, it is preferable that the depth be equal to or more than 50% of the thickness T2 of the base substrate 100C. Additionally, although the upper limit of the depth T3 is not particularly limited, it is preferable that the upper limit be about 90% of the thickness T2 of the base substrate 100C if the mechanical strength of the base substrate 100C is taken into consideration. That is, it is preferable that T3 and T2 satisfy the relationship that is 0.5T2≤T3≤0.9T2. Thereby, the separation distance between the bottom surface 161C of the groove 160C and the upper surface of the base substrate 100C becomes sufficiently short, and a crack that is made from the groove 160C can be more reliably and rapidly made to reach the upper surface of the base substrate 100C. Therefore, singulation to be described below can be reliably performed.

Figure 16B:
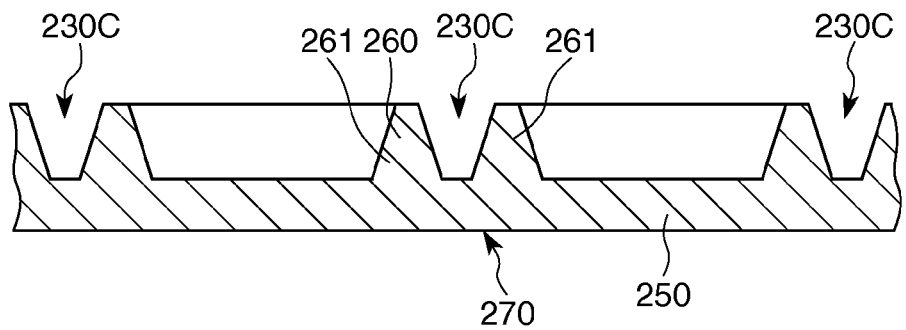
Figure 16C:
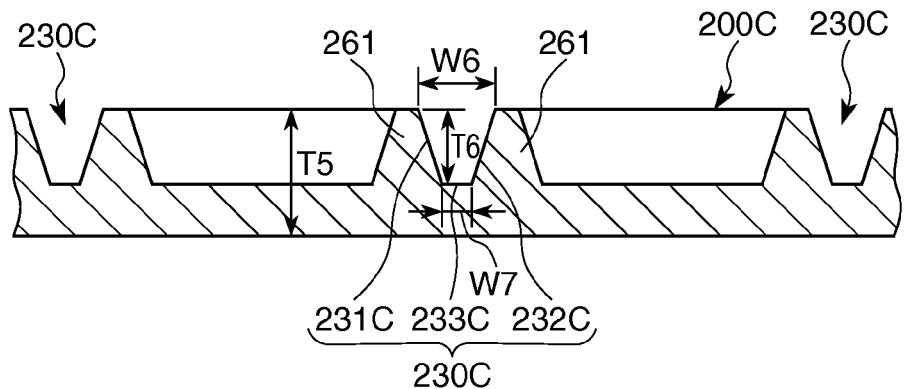

On the other hand, as for the lid substrate 200C, first, as illustrated in FIG. 16B, similar to the aforementioned third embodiment, the ceramic green sheet 270 in which the grid-like protrusions 260 are formed on the ceramic green sheet 250, and next, grid-like grooves 230C that open to the upper surfaces (top portions) of the protrusions 260 are formed. The protrusions 260 are split into a plurality of frame-shaped protrusions 261 that are arranged in a matrix by forming the grooves 230C. Next, the ceramic green sheet 270 is sintered. Thereby, as illustrated in FIG. 16C, the lid substrate 200C is obtained.

In the lid substrate 200C, the groove 230C has a pair of side surfaces 231C and 232C, and a bottom surface 233C that couples the side surfaces 231C and 232C together at lower ends thereof. Additionally, although the depth T6 of the groove 230C is not particularly limited, it is preferable that the depth be equal to or more than 50% of the thickness T5 of the lid substrate 200C. Although the upper limit of the depth T6 is not particularly limited, it is preferable that the upper limit be about 90% of the thickness T5 of the lid substrate 200C if the mechanical strength of the lid substrate 200C is taken into consideration. That is, it is preferable that T5 and T6 satisfy the relationship that is $0.5T5 \leq T6 \leq 0.9T5$. Thereby, the separation distance between the bottom surface 233C of the groove 230C and the lower surface of the lid substrate 200C becomes sufficiently short, and a crack that is made from the groove 230C can be more reliably and rapidly made to reach the lower surface of the lid substrate 200C. Therefore, singulation to be described below can be reliably performed.

Although the width W6 of the opening of the groove 230C is not particularly limited, it is preferable that the width be from about 10 μm to about 200 μm. Although the low-melting glass 300 is coated on the upper surface of each protrusion 261 in steps to be described below, the upper surfaces of the adjacent protrusions 261 can be necessarily and sufficiently spaced apart from each other by adopting the numerical ranges as described above. Therefore, during a manufacturing step, a non-contact state between the low-melting glass 300 coated on the upper surface of one protrusion 261 and the low-melting glass 300 coated on the upper surface of the other protrusion 261 can be maintained.

Additionally, although the width W7 of the bottom surface 233C of the groove 230C is not particularly limited, it is so preferable that the width be smaller, specifically, it is preferable that the width be equal to or less than 10 μm. Thereby, since a crack can be made from the bottom surface 233C of the groove 230C, that is, since a place where a crack is made can be controlled with high precision, singulation can be more reliably performed.

Figure 16D:
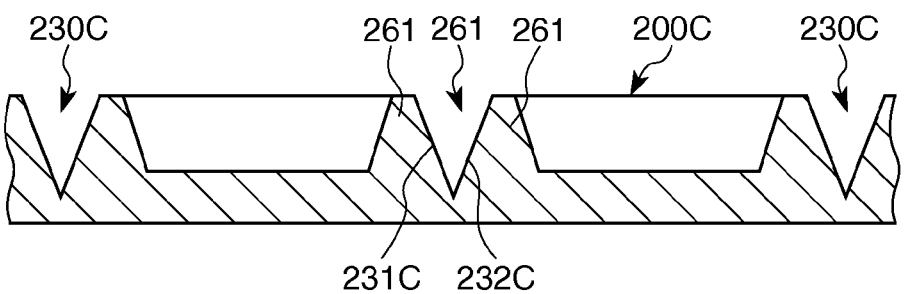

In addition, the bottom surface 233C may be omitted. That is, as illustrated in FIG. 16D, the width W7 may be 0 μm, and the groove 230C may be a substantially V-shaped groove having a pointed tip. By adopting such a shape, the above-described effects become more remarkable.

Mounting Step

Next, the low-melting glass 300 in a liquid state is coated over the whole circumference of the upper surface of each protrusion 261 of 11d substrate 200C, and is temporarily baked. Thereafter, the vibrating element 590 is mounted within each region partitioned by the groove 160C in the upper surface (surface opposite to the groove 160C) of the base substrate 100C.

Lid Substrate Placing Step

Next, the lid substrate 200C is placed on the base substrate 100C. Thereby, a laminate 400C is obtained.

Here, in the laminate 400C, one vibrating element 590 is covered with one frame-shaped protrusion 261. Additionally, in the laminate 400C, the groove 160C is formed so as to overlap the groove 230C. In other words, the groove 160C is formed so that a bottom portion 161C thereof faces the opening of the groove 230C in a plan view in the thickness direction of the laminate 400C. Thereby, during singulation to be described below, a crack that is made from the bottom portion 161B of the groove 160C can be more reliably guided to the groove 230C.

Pressure-Reducing Step

Since the pressure-reducing step is the same as the pressure-reducing step of the aforementioned first embodiment, description thereof is omitted.

Melting Step

Since the melting step is the same as the melting step of the aforementioned first embodiment, description thereof is omitted.

Singulating Step

Next, the plurality of electronic components 500B contained in the laminate 400C are singulated. For example, as illustrated in FIGS. 17B and 18A, the laminate 400C is placed on the soft sheet 600, with the base substrate 100C being turned down. Then, the laminate 400C is locally pressed from above. Then, the base substrate 100C is deformed (is deformed in the direction of an arrow in the drawing) so as to expand the opening of the groove 160C. Thereby, a crack C1 is created from the bottom portion 161C, and the crack C1 reaches the opening of the groove 230C in the upper surface of the base substrate 100C. Moreover, the lid substrate 200C is deformed (is deformed in the direction of an arrow in the drawing) so as to expand the opening of the groove 230C. Thereby, a crack C2 is created from the bottom surface 233C of the groove 230C, and the crack C2 reaches the upper surface of the lid substrate 200C. Thereby, as illustrated in FIG. 18B, the electronic component 500B contained in the laminate 400C is singulated. In addition, as for the generation order of the cracks C1 and C2, any one of the cracks may be first generated, or both the cracks may be simultaneously generated.

The method for manufacturing the electronic component 500B has been described above.

The same effects as the aforementioned first embodiment can also be exhibited by such a fourth embodiment.

Here, as illustrated in FIG. 19, the grooves 210 may be formed in the upper surface (surface opposite to the grooves 230C) of the lid substrate 200C. Thereby, the singulation can be more simply and reliably performed.

3. Electronic Apparatus

Next, electronic apparatuses (electronic apparatus according to the invention) to which the electronic component manufactured by the method for manufacturing an electronic component according to the invention is applied will be described in detail with reference to FIGS. 20 to 22.

Figure 20:
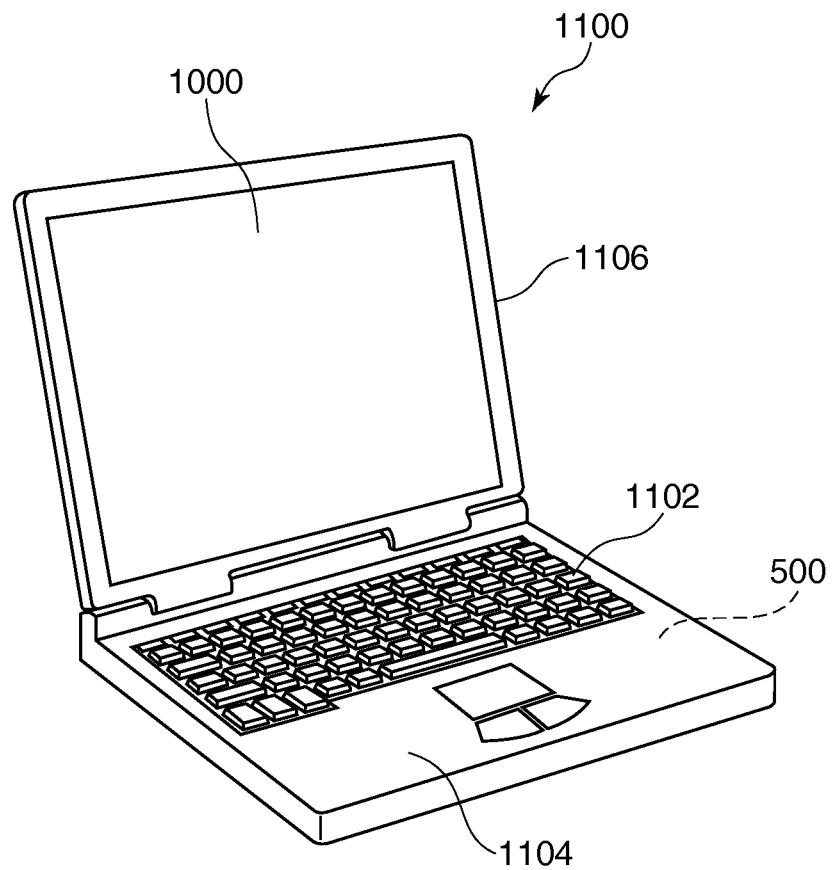
FIG. 20 is a perspective view illustrating the configuration of a mobile (or lap top) personal computer to which the electronic component manufactured by the method for manufacturing an electronic component according to the invention is applied.

FIG. 20 is a perspective view illustrating the configuration of a mobile (or lap top) personal computer to which an electronic apparatus including the electronic component manufactured by the method for manufacturing an electronic component according to the invention is applied. As illustrated in this drawing, the personal computer 1100 is constituted of a main body unit 1104 including a keyboard 1102 and a display unit 1106 including a display section 1000, and the display unit 1106 is supported so as to be rotatable via a hinge structure with respect to the main body unit 1104. The electronic component 500 that functions as a filter, a resonator, a reference clock, or the like is built in such a personal computer 1100.

Figure 21:
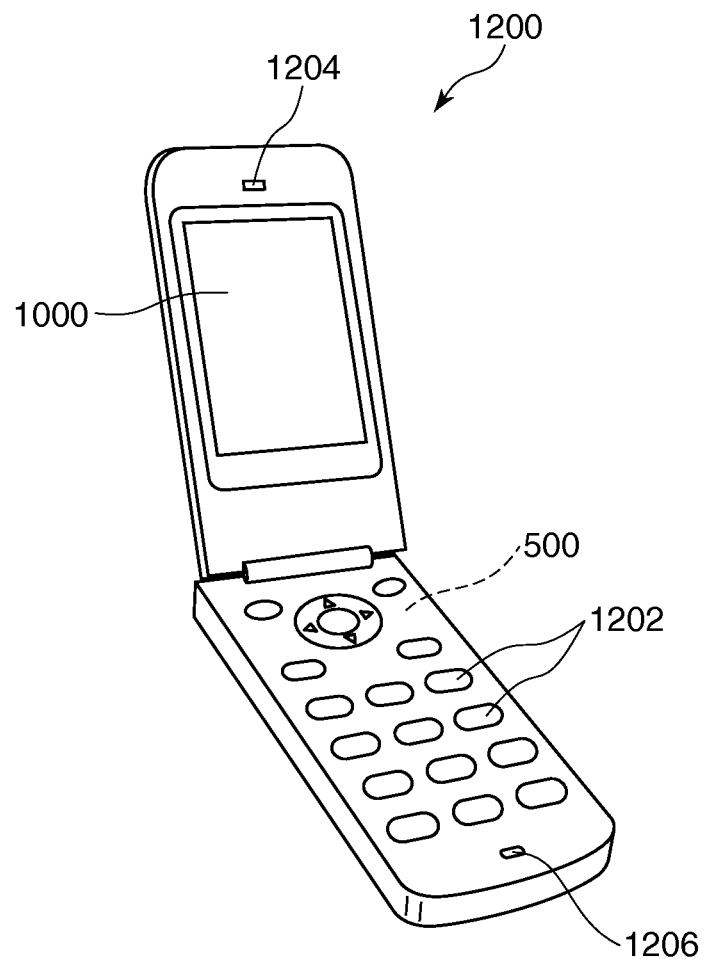
FIG. 21 a perspective view illustrating the configuration of a cellular phone (also including PHS) to which the electronic component manufactured by the method for manufacturing an electronic component according to the invention is applied.

FIG. 21 a perspective view illustrating the configuration of a cellular phone (also including PHS) to which the electronic component manufactured by the method for manufacturing an electronic component according to the invention is applied. As illustrated in this drawing, the cellular phone 1200 includes a plurality of operation buttons 1202, an ear piece 1204, and a mouth piece 1206, and a display section 1000 is arranged between the operation buttons 1202 and the ear piece 1204. The electronic component 500 that functions as a filter, a resonator, or the like is built in such a cellular phone 1200.

Figure 22:
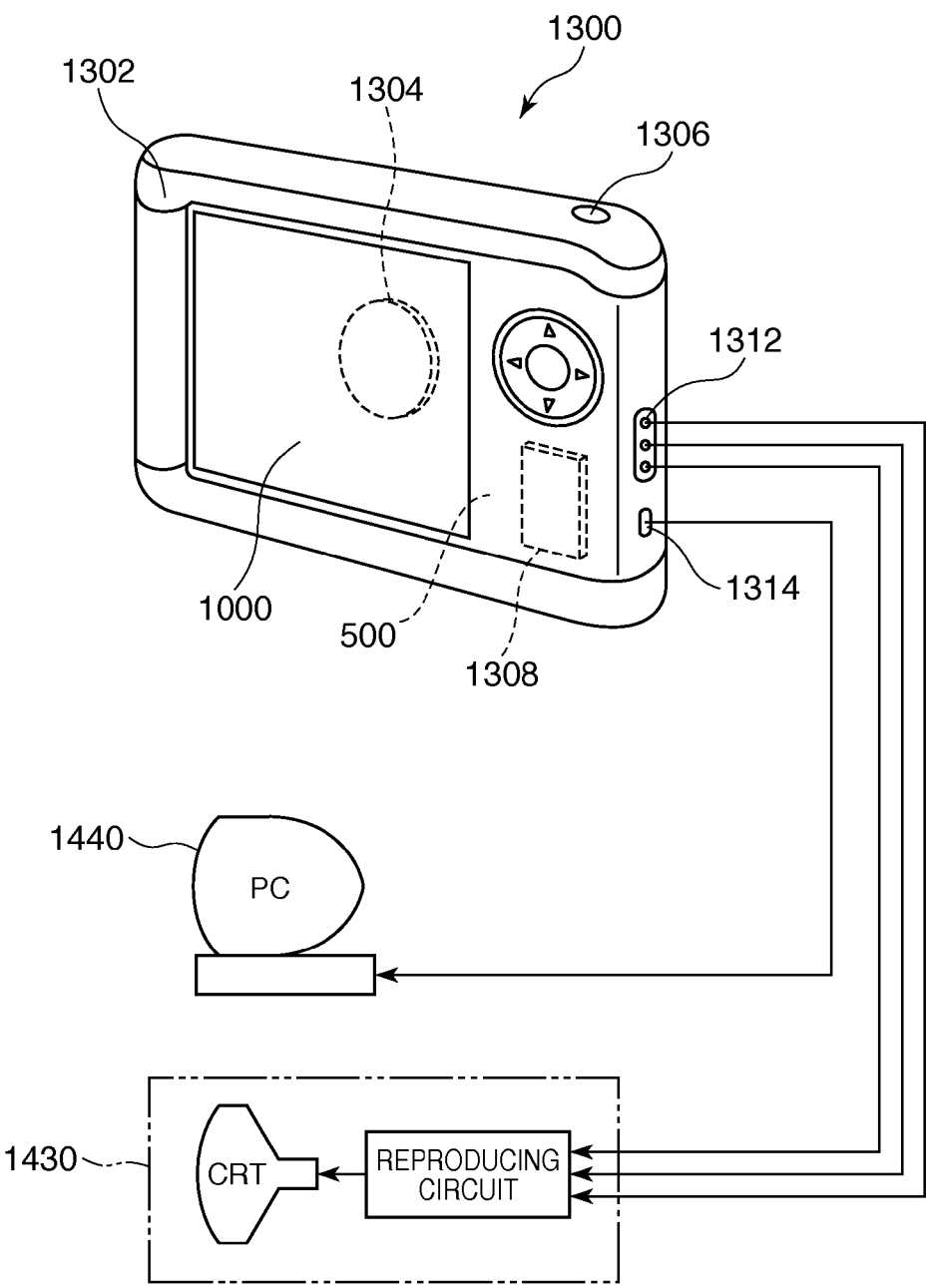
FIG. 22 is a perspective view illustrating the configuration of a digital still camera to which the electronic component manufactured by the method for manufacturing an electronic component according to the invention is applied.

FIG. 22 is a perspective view illustrating the configuration of a digital still camera to which an electronic apparatus including the electronic component manufactured by the method for manufacturing an electronic component according to the invention is applied. In addition, in this drawing, a connection with an external apparatus is also illustrated in a simplified manner. Here, while an ordinary camera exposes a silver-halide photo film in accordance with the light image of a subject, the digital still camera 1300 generates an imaging signal (image signal) by performing photoelectric conversion of the light image of a subject by using an imaging device, such as a charge coupled device (CCD).

A display section is disposed on the rear surface of a case (body) 1302 of the digital still camera 1300 and is configured so as to perform display on the basis of an imaging signal acquired by the CCD, and the display section serves as a finder that displays a subject as an electronic image. Additionally, a light receiving unit 1304 that includes an optical lens (imaging optical system), a CCD, and the like is provided on the front surface side (the rear surface side in the drawing) of the case 1302.

If a photographer checks a subject image displayed on the display section and presses a shutter button 1306, an imaging signal of the CCD at the point of time is transmitted to a memory 1308 and is stored therein. Additionally, in the digital still camera 1300, a video signal output terminal 1312 and a data communication input-output terminal 1314 are provided on the side surface of the case 1302. As illustrated in the drawing, if necessary, a television monitor 1430 is connected to the video signal output terminal 1312, and a personal computer 1440 is connected to the data communication input-output terminal 1314. Moreover, the digital still camera is configured such that an imaging signal stored in the memory 1308 is output to the television monitor 1430 or the personal computer 1440 in accordance with a predetermined operation. The electronic component 500 that functions as a filter, a resonator, or the like is built in such a digital still camera 1300.

In addition, the electronic apparatus that includes the electronic component according to the invention can be applied to, for example, an ink jet ejecting apparatus (for example, an ink jet printer), a lap top personal computer, a television set, a video camera, a video tape recorder, a car navigation apparatus, a pager, an electronic organizer (including a type that includes a communication function), an electronic dictionary, a calculator, an electronic game device, a word processor, a workstation, a television phone, a security television monitor, an electronic binocular telescope, a POS terminal, a medical apparatus (for example, an electronic thermometer, a sphygmomanometer, a blood glucose monitoring system, an electrocardiogram measurement device, an ultrasonic diagnosis device, or an electronic endoscope), a fish-finder, various measurement apparatuses, meters and gauges (for example, meters and gauges for vehicles, airplanes, or ships), a flight simulator, and the like, in addition to the personal computer (mobile personal computer) illustrated in FIG. 20, the cellular phone 1200 illustrated in FIG. 21, and the digital still camera 1300 illustrated in FIG. 22.

Although the method for manufacturing an electronic component and the electronic apparatus related to the invention have been described above on the basis of the illustrated embodiments, the invention is not limited to this, and the configurations of the respective parts can be replaced with arbitrary configurations having the same functions.

Additionally, other arbitrary structures may be added to the invention. Additionally, the respective embodiments may be appropriately combined.

The entire disclosure of Japanese Patent Application No. 2012-114997, filed May 18, 2012 is expressly incorporated by reference herein.

What is claimed is:

1. A method for manufacturing an electronic component comprising:
   preparing a base substrate that comprises front and rear surfaces, comprises a plurality of singulation regions arranged on the front surface thereof, and comprises grooves for singulating the singulation regions arranged on the rear surface thereof, and a lid substrate that comprises grooves for singulation together with the base substrate arranged therein;
   mounting a functional element on each of the singulation regions of the base substrate;
   joining the surface of the lid substrate, where the grooves are arranged, to the base substrate via a glass material so as to cover the functional element in each of the singulation regions, thereby obtaining a laminate; and
   singulating each of the singulation regions by breaking the laminate along a groove arranged in the base substrate and a groove arranged in the lid substrate.

2. The method for manufacturing an electronic component according to claim 1,
   wherein the base substrate comprises a frame-shaped protrusion that protrudes from the front surface of the base substrate and comprises the functional element to be arranged therein, and a bottomed recess between a pair of the adjacent protrusions, and
   wherein the laminate is configured such that a bottom portion of a groove arranged in the base substrate and a groove arranged in the lid substrate at least partially overlap a bottom surface of the recess in a plan view in the thickness direction of the laminate, respectively.

3. The method for manufacturing an electronic component according to claim 1,
   wherein the lid substrate comprises a plurality of recesses in the surface of the lid substrate where the grooves are arranged, each recess accommodating the functional element in each of the singulation regions,
   wherein a groove arranged in the lid substrate is located between a pair of the adjacent recesses in a plan view in the thickness direction of the lid substrate, and is provided so as to split the recesses, and
   wherein the laminate is configured such that a bottom portion of a groove arranged in the base substrate and a bottom surface of a recess arranged in the lid substrate at least partially overlap each other in a plan view in the thickness direction of the laminate.

4. A method for manufacturing an electronic component comprising:
   preparing a base substrate that comprises a plurality of singulation regions, and comprises grooves for singulating the singulation regions, and a lid substrate that comprises front and rear surfaces and comprises grooves for singulation together with the base substrate arranged on the front surface thereof;
   mounting a functional element on each of the singulation regions of the front surface of the base substrate where the grooves are arranged;

joining the rear surface side of the lid substrate to the base substrate via a glass material so as to cover the functional element in each of the singulation regions, thereby obtaining a laminate; and singulating the laminate in each of the singulation regions along a groove arranged in the base substrate and a groove arranged in the lid substrate.

5. The method for manufacturing an electronic component according to claim 4, wherein the lid substrate comprises a frame-shaped protrusion that protrudes from the rear surface of the lid substrate and comprises a functional element accommodated therein, and a bottomed recess between a pair of the adjacent protrusions, and wherein the laminate is configured such that a bottom portion of a groove arranged in the base substrate and a groove arranged in the lid substrate at least partially overlap a bottom surface of the recess in a plan view in the thickness direction of the laminate, respectively.

6. The method for manufacturing an electronic component according to claim 4, wherein the base substrate comprises a plurality of recesses in a surface where the grooves are arranged, each recess accommodating the functional element in each of the singulation regions, wherein a groove arranged in the base substrate is located between a pair of the adjacent recesses in a plan view in the thickness direction of the base substrate, and is provided so as to split the recesses, wherein the laminate is configured such that a bottom portion of a groove arranged in the lid substrate and a bottom surface of a recess arranged in the base substrate at least partially overlap each other in a plan view in the thickness direction of the laminate.

7. The method for manufacturing an electronic component according to claim 1, wherein the glass material is arranged in the laminate so as to avoid a groove arranged in the base substrate and a groove arranged in the lid substrate.

8. The method for manufacturing an electronic component according to claim 4, wherein the glass material is arranged in the laminate so as to avoid a groove arranged in the base substrate and a groove arranged in the lid substrate.

\* \* \* \* \*